(12) United States Patent
Park et al.

(10) Patent No.: US 12,356,635 B2
(45) Date of Patent: Jul. 8, 2025

(54) THREE-DIMENSIONAL MEMORY DEVICE INCLUDING A VARIABLE RESISTANCE MEMORY

(71) Applicant: SAMSUNG ELECTRONICS CO., LTD., Suwon-si (KR)

(72) Inventors: Hyunmog Park, Seoul (KR); Jungyu Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 683 days.

(21) Appl. No.: 17/738,366

(22) Filed: May 6, 2022

(65) Prior Publication Data
US 2022/0384524 A1 Dec. 1, 2022

(30) Foreign Application Priority Data
May 26, 2021 (KR) .................. 10-2021-0067894

(51) Int. Cl.
*H10B 63/00* (2023.01)
*H01L 23/528* (2006.01)
*H10N 70/00* (2023.01)

(52) U.S. Cl.
CPC ....... *H10B 63/845* (2023.02); *H01L 23/5283* (2013.01); *H10N 70/826* (2023.02)

(58) Field of Classification Search
CPC .............................. H10B 63/00; H01L 23/528
See application file for complete search history.

(56) References Cited

U.S. PATENT DOCUMENTS

| 8,289,763 | B2 | 10/2012 | Liu |
| 8,564,050 | B2 | 10/2013 | Park et al. |
| 8,923,057 | B2 | 12/2014 | Son et al. |
| 9,171,584 | B2 | 10/2015 | Scheuerlein et al. |
| 9,419,217 | B2 | 8/2016 | Vereen et al. |
| 10,032,791 | B2 | 7/2018 | Lee et al. |
| 10,461,125 | B2 | 10/2019 | Pirovano et al. |

(Continued)

FOREIGN PATENT DOCUMENTS

| KR | 10-2015-0027754 A | 3/2015 |
| KR | 10-2018-0103233 A | 9/2018 |
| KR | 10-2020-0008704 | 1/2020 |

OTHER PUBLICATIONS

Office Action dated Apr. 4, 2025 issued in corresponding Korean Patent Application No. 10-2021-0067894. (Note: KR 10-2020-0008704 A cited in previous IDS.).

*Primary Examiner* — Marvin Payen
(74) *Attorney, Agent, or Firm* — MORGAN, LEWIS & BOCKIUS LLP

(57) ABSTRACT

A three-dimensional memory device includes: a plurality of word line groups including a plurality of word lines; a plurality of bit line groups extending in a vertical direction and including a plurality of bit lines spaced apart from the plurality of word lines; a plurality of memory cells arranged between the plurality of word lines and the plurality of bit lines and including a switching component and a variable resistance memory component; a plurality of global bit line groups connected to the plurality of bit line groups, wherein each of the plurality of global bit line groups includes a plurality of global bit lines electrically connected to a plurality of bit lines included in one bit line group, respectively; and a pad structure including a plurality of connection units and a plurality of pad layers, wherein the plurality of connection units are connected to the plurality of word line groups.

20 Claims, 28 Drawing Sheets

(56) References Cited

U.S. PATENT DOCUMENTS

| | | |
|---|---|---|
| 10,629,609 B2 | 4/2020 | Lee et al. |
| 10,971,548 B2 | 4/2021 | Eun et al. |
| 2013/0308363 A1 | 11/2013 | Scheuerlein et al. |
| 2020/0027925 A1 | 1/2020 | Eun et al. |
| 2020/0243557 A1 | 7/2020 | Xu et al. |

A1-A1'

A2-A2'

A3-A3'

A1-A1'

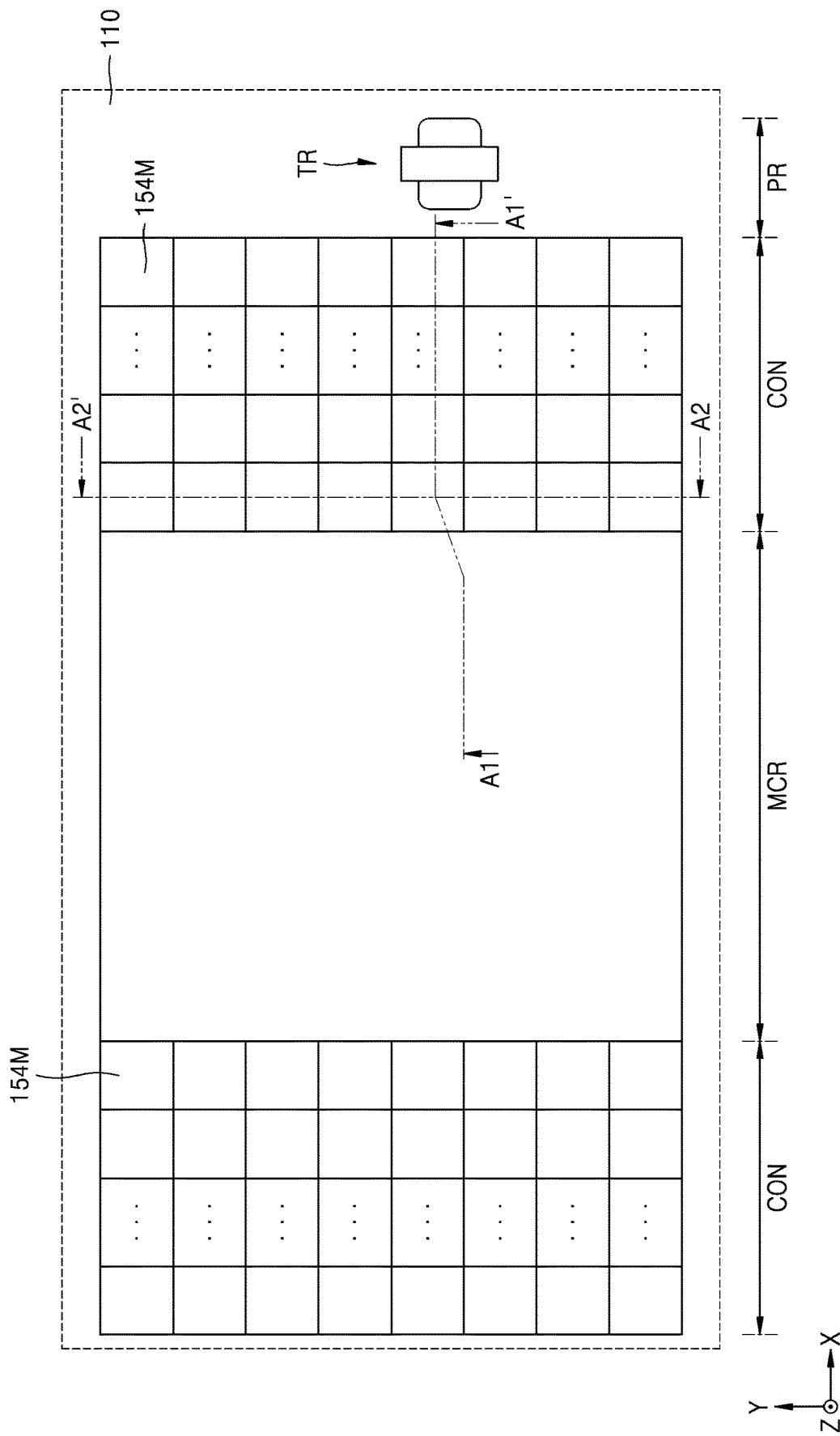

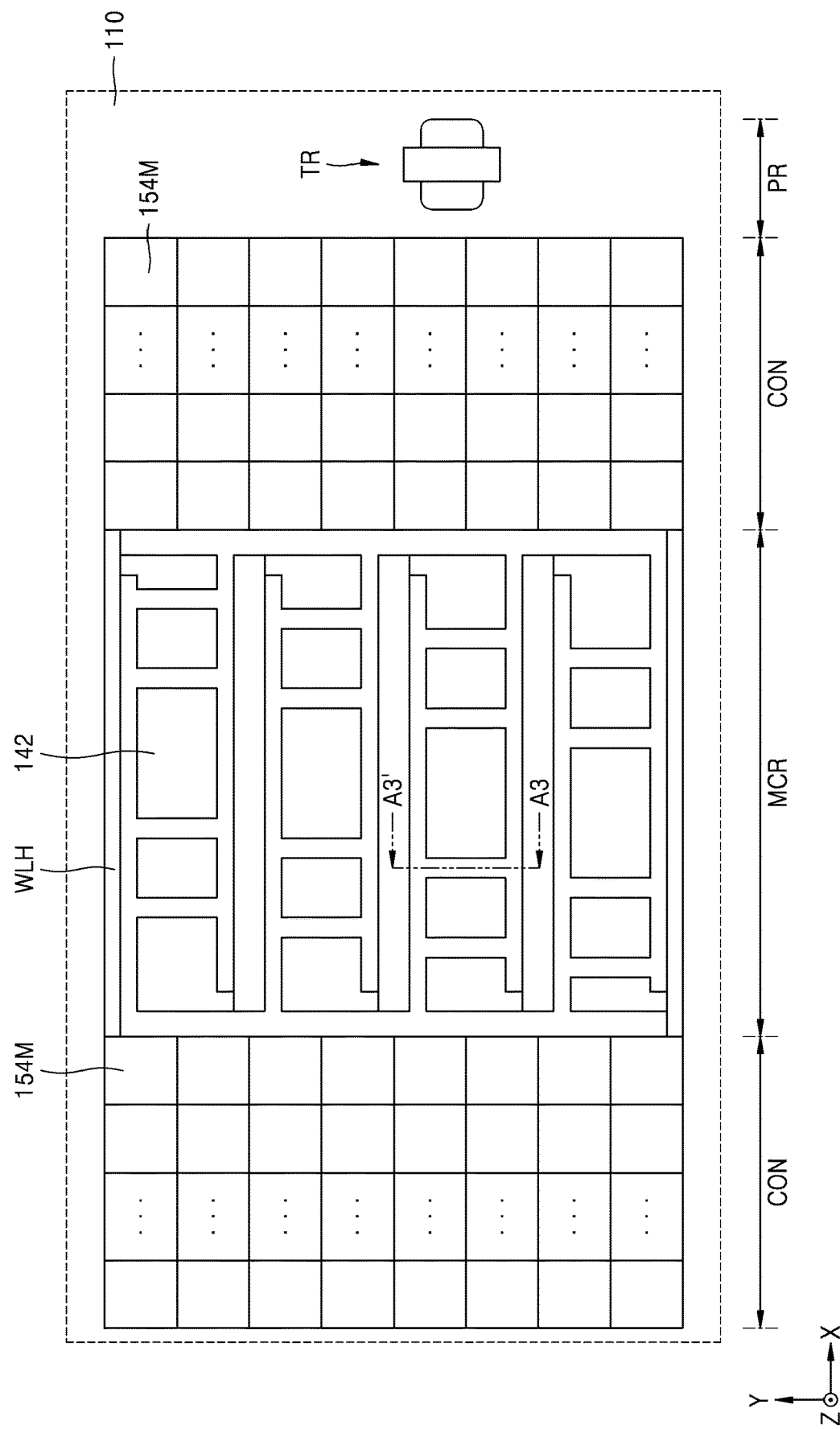

A3-A3'

A3-A3'

THREE-DIMENSIONAL MEMORY DEVICE INCLUDING A VARIABLE RESISTANCE MEMORY

CROSS-REFERENCE TO RELATED APPLICATION

This application claims priority under 35 U.S.C. § 119 to Korean Patent Application No. 10-2021-0067894, filed on May 26, 2021, in the Korean Intellectual Property Office, the disclosure of which is incorporated by reference herein in its entirety.

TECHNICAL FIELD

The present inventive concept relates to a three-dimensional memory device, and more particularly, to a three-dimensional memory device including a variable resistance memory.

DISCUSSION OF THE RELATED ART

As electronic products are becoming lighter, thinner, shorter and smaller, demand for high integration of memory devices is increasing. A two-dimensional variable resistance memory device having a cross point arrangement, in which each memory cell includes a variable resistance memory layer and a switching element layer, has been under development. However, because the density of a memory device is determined by an area occupied by a unit memory cell, increasing the density of the two-dimensional variable resistance memory device may be limited. Therefore, to increase the density of the memory device, a variable resistance memory device having a three-dimensional arrangement is under development.

SUMMARY

In an exemplary embodiment of the present inventive concept, a three-dimensional memory device includes: a plurality of word line groups spaced apart from one another on a substrate in a vertical direction, wherein each of the plurality of word line groups includes a plurality of word lines extending in a first horizontal direction and being spaced apart from one another in a second horizontal direction crossing the first horizontal direction; a plurality of bit line groups spaced apart from one another on the substrate in the first horizontal direction, wherein each of the plurality of bit line groups extends in the vertical direction and includes a plurality of bit lines spaced apart from the plurality of word lines included in the plurality of word line groups in the second horizontal direction, wherein the vertical direction crosses the first and second horizontal directions; a plurality of memory cells arranged between the plurality of word lines and the plurality of bit lines, wherein each of the plurality of memory cells includes a switching component and a resistance memory component; a plurality of global bit line groups respectively connected to the plurality of bit line groups, wherein each of the plurality of global bit line groups includes a plurality of global bit lines electrically connected to a plurality of bit lines included in one bit line group, respectively, and extends in the second horizontal direction; and a pad structure arranged on the substrate and including a plurality of connection units and a plurality of pad layers, wherein the plurality of connection units are respectively connected to the plurality of word line groups, and the plurality of pad layers respectively extend from the plurality of connection units.

In an exemplary embodiment of the present inventive concept, a three-dimensional memory device includes: a plurality of word lines extending in a first horizontal direction on a substrate and spaced apart from one another in a second horizontal direction and a vertical direction, wherein the second horizontal direction crosses the first horizontal direction, and the vertical direction crosses the first and second horizontal directions; a plurality of bit lines disposed on the substrate, and extending in the vertical direction, wherein the plurality of bit lines are spaced apart from the plurality of word lines in the second horizontal direction, and spaced apart from one another in the first horizontal direction; a plurality of memory cells arranged between the plurality of word lines and the plurality of bit lines, wherein each of the plurality of memory cells includes a switching component and a variable resistance memory component; a plurality of global bit lines arranged on the plurality of bit lines and extending in the second horizontal direction; and a pad structure arranged on the substrate and including a plurality of connection units and a plurality of pad layers, wherein each of the plurality of connection units is commonly connected to at least two word lines arranged at the same vertical level among the plurality of word lines, wherein each of the plurality of pad layers extends from the plurality of connection units, and wherein the pad structure includes a staircase shape in the first horizontal direction and the second horizontal direction.

According to an exemplary embodiment of the present inventive concept, a three-dimensional memory device includes: a peripheral circuit structure arranged on a substrate; and a memory cell array arranged on the peripheral circuit structure, wherein the memory cell array includes: a plurality of first word lines extending in a first horizontal direction and spaced apart from one another in a second horizontal direction and a vertical direction, wherein the second horizontal direction crosses the first horizontal direction, and the vertical direction crosses the first and second horizontal directions; a plurality of second word lines spaced apart from the plurality of first word lines in the second horizontal direction and extending in the first horizontal direction; a plurality of bit lines arranged between the plurality of first word lines and the plurality of second word lines, and extending in the vertical direction, wherein the plurality of bit lines are spaced apart from one another in the first horizontal direction; a plurality of memory cells arranged between the plurality of first word lines and the plurality of bit lines and between the plurality of second word lines and the plurality of bit lines, wherein each of the plurality of memory cells includes a switching component and a variable resistance memory component; a plurality of global bit lines arranged on the plurality of bit lines and extending in the second horizontal direction; a first pad structure connected to the plurality of first word lines and including a plurality of first connection units and a plurality of first pad layers respectively extending from the plurality of first connection units, wherein each of the plurality of first connection units is connected to at least two first word lines arranged at the same vertical level among the plurality of first word lines; and a second pad structure connected to the plurality of second word lines and including a plurality of second connection units, each of which is, and a plurality of second pad layers respectively extending from the plurality of second connection units, wherein each of the plurality of second connection units is connected to at least two second word lines arranged at the same vertical level among the plurality of second word lines, and wherein each of the first pad structure and the second pad structure includes a staircase shape in the first horizontal direction and the second horizontal direction.

BRIEF DESCRIPTION OF THE DRAWINGS

The above and other aspects of the present inventive concept will become more apparent by describing in detail embodiments thereof, with reference to the accompanying drawings, in which:

FIGS. 12A to 21 are schematic diagrams illustrating a method of manufacturing a three-dimensional memory device according to an exemplary embodiment of the present inventive concept. Specifically, FIGS. 12A, 13A, 14A, 15A, and 20A are plan views of a three-dimensional memory device 100 illustrated in the order of processes.

DETAILED DESCRIPTION OF THE EMBODIMENTS

Figure 1:
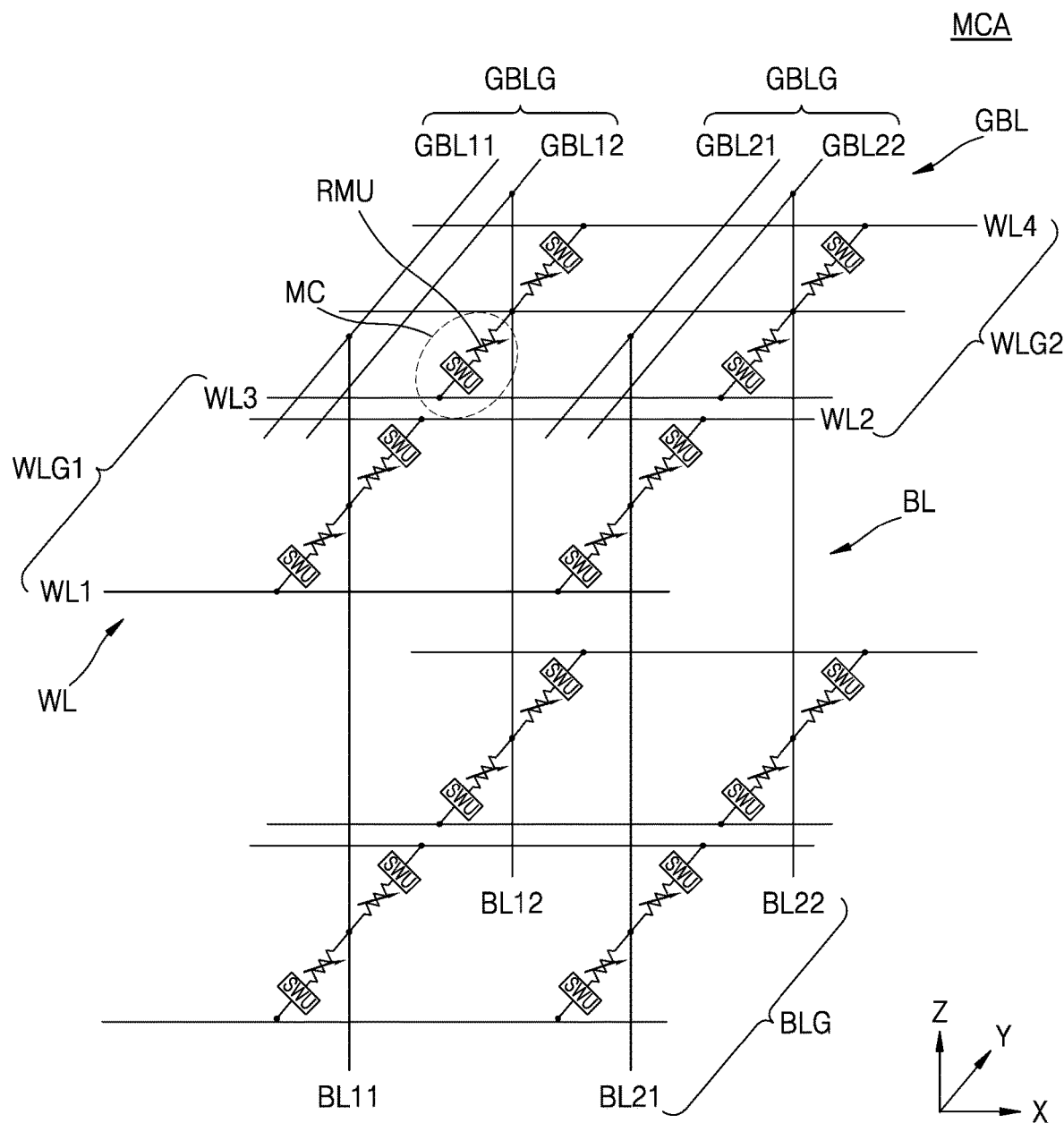
FIG. 1 is a circuit diagram illustrating a memory cell array according to an exemplary embodiment of the present inventive concept.

Hereinafter, exemplary embodiments of the present inventive concept will be described in detail with reference to the accompanying drawings. FIG. 1 is a circuit diagram illustrating a memory cell array MCA according to an exemplary embodiment of the present inventive concept.

Referring to FIG. 1, the memory cell array MCA may include a plurality of word lines WL, a plurality of bit lines BL, a plurality of memory cells MC, and a plurality of global bit lines GBL. The plurality of word lines WI may extend in a first horizontal direction X and are spaced apart from one another in a second horizontal direction Y and a vertical direction Z. The plurality of bit lines BL may extend in the vertical direction Z and are spaced apart from one another in the first horizontal direction X and the second horizontal direction Y. The plurality of memory cells MC may be connected to the plurality of word lines WL and the plurality of bit lines BL between the plurality of word lines WL and the plurality of bit lines BL. The plurality of global bit lines GBL may be connected to the plurality of bit lines BL and extend in the second horizontal direction Y.

Each of the plurality of memory cells MC may include a variable resistance memory unit RMU for storing information and a switching unit SWU for selecting a memory cell. Here, the switching unit SWU may be referred to as a selection element. For example, as the plurality of switching units SWU of the plurality of memory cells MC selected through the plurality of word lines WL and the plurality of bit lines BL are turned on, voltages are applied to the plurality of variable resistance memory units RMU of the plurality of memory cells MC so that currents may flow to the plurality of variable resistance memory units RMU. For example, each of the plurality of variable resistance memory units RMU may include a phase change material layer that may reversibly change between a first state and a second state. However, the variable resistance memory unit RMU is not limited thereto and may include any variable resistor of which resistance value varies in accordance with an applied voltage. For example, resistance of each of the plurality of variable resistance memory units RMU may reversibly change between the first state and the second state in accordance with the voltage applied to each of the plurality of variable resistance memory units RMU of the plurality of selected memory cells MC.

In accordance with the change in resistance of the variable resistance memory unit RMU, digital information such as "0" or "1" may be stored in or erased from the memory cell MC. For example, data may be written in the memory cell MC in a high resistance state "0" or a low resistance state "1". However, data stored in the memory cell MC according to an exemplary embodiment the present inventive concept is not limited to the digital information in the illustrated high resistance state "0" and low resistance state "1" and data in various resistance states may be stored in the memory cell MC.

By selection of a word line WL and a bit line BL, an arbitrary memory cell MC may be addressed. By applying a predetermined signal between the word line WL and the bit line BL to program the memory cell MC and to measure a current value through the bit line BL, information in accordance with a resistance value of a variable resistance memory unit RMU configuring the corresponding memory cell MC may be read.

As illustrated in FIG. 1, the memory cell array MCA may include a plurality of first word line groups WLG1 and a plurality of second word line groups WLG2. The plurality of first word line groups WLG1 may be spaced apart from one another in a vertical direction Z and each of the plurality of first word line groups WLG1 may include odd word lines WL and WL3. The plurality of second word line groups WLG2 may be spaced apart from one another in the vertical direction Z and each of the plurality of second word line groups WLG2 may include even word lines WL2 and WL4. The same voltage (or, e.g., signal) may be applied to the odd word lines WL1 and WL3 included in each of the plurality of first word line groups WLG1 through a common connection terminal, and the same voltage (or, e.g., signal) may be applied to the even word lines WL2 and WL4 included in each of the plurality of second word line groups WLG2 through a common connection terminal. However, the present inventive concept is not limited thereto. For example, a voltage applied to the odd word lines WL1 and WL3 may be different from the voltage applied to the even word lines WL2 and WL4.

As illustrated in FIG. 1, the memory cell array MCA may include a plurality of bit line groups BLG and a plurality of global bit line groups GBLG. The plurality of bit line groups BLG may be spaced apart from one another in a first horizontal direction X. The plurality of global bit line groups GBLG may be respectively connected to the plurality of bit line groups BLG, and may be spaced apart from one another in the first horizontal direction X.

For example, in FIG. 1, it is illustrated that four bit lines BL and four global bit lines GBL are arranged. One bit line group BLG may include bit lines BL11 and BL12, and one global bit line group GBLG may include global bit lines GBL11 and GBL12 respectively connected to the bit lines BL11 and BL12. Another bit line group BLG may include bit lines BL21 and BL22, and another global bit line group GBLG may include global bit lines GBL21 and GBL22 respectively connected to the bit lines BL21 and BL22. For example, an individual voltage (or, e.g., signal) may be applied through a global bit line GBL connected to a corresponding bit line BL included in one bit line group BLG.

Figure 2:
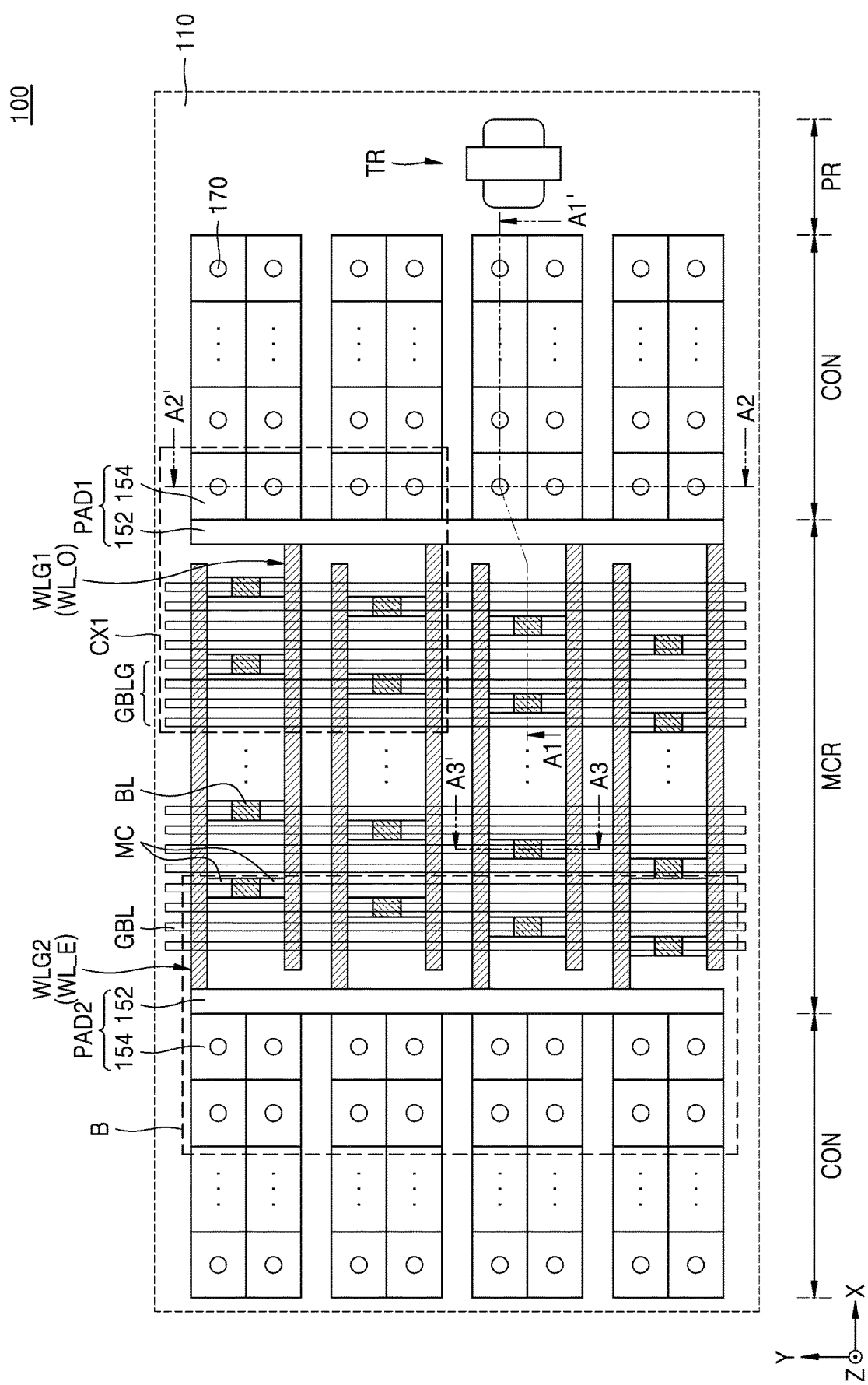
FIG. 2 is a plan view illustrating a schematic configuration of a three-dimensional memory device according to an exemplary embodiment of the present inventive concept.
Figure 3:
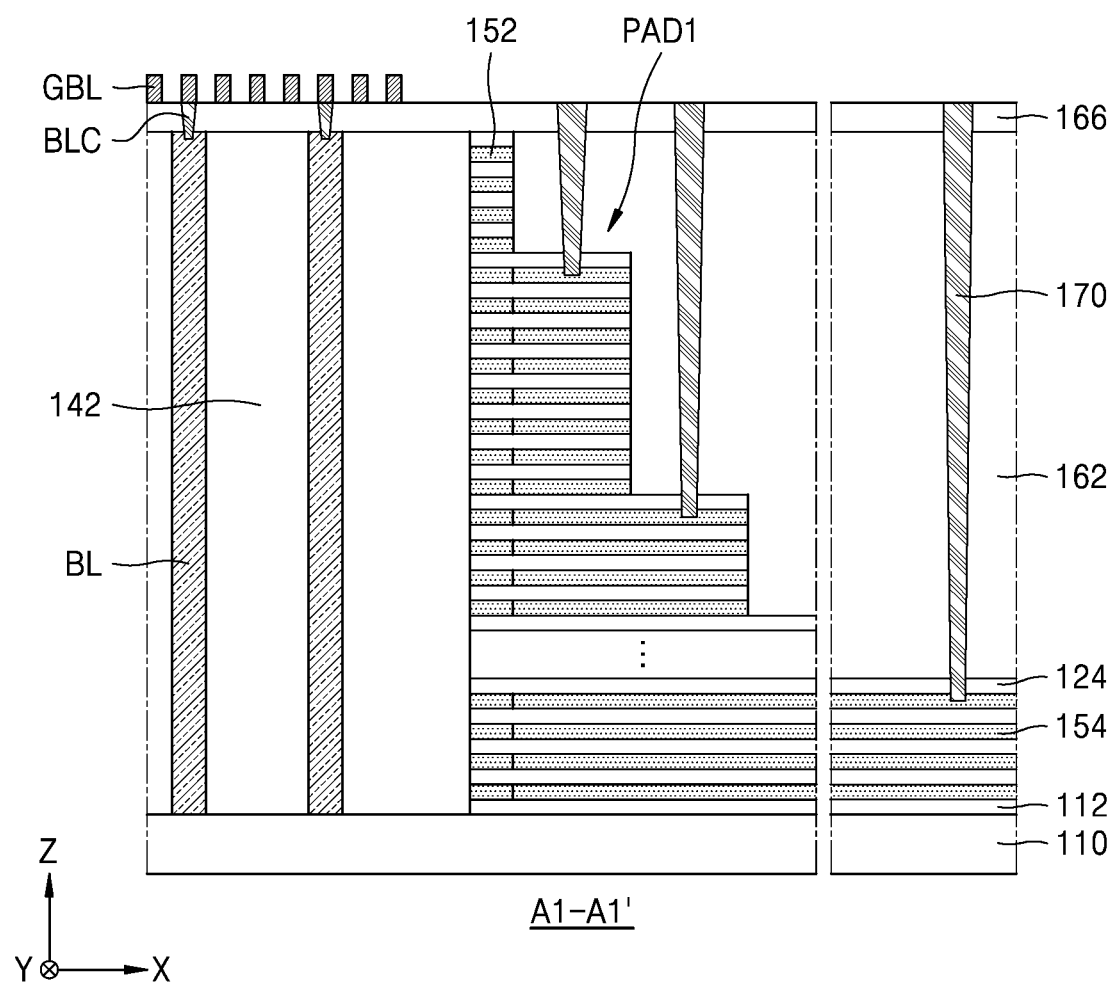
FIG. 3 is a cross-sectional view taken along the line A1-A1' of FIG. 2.
Figure 4:
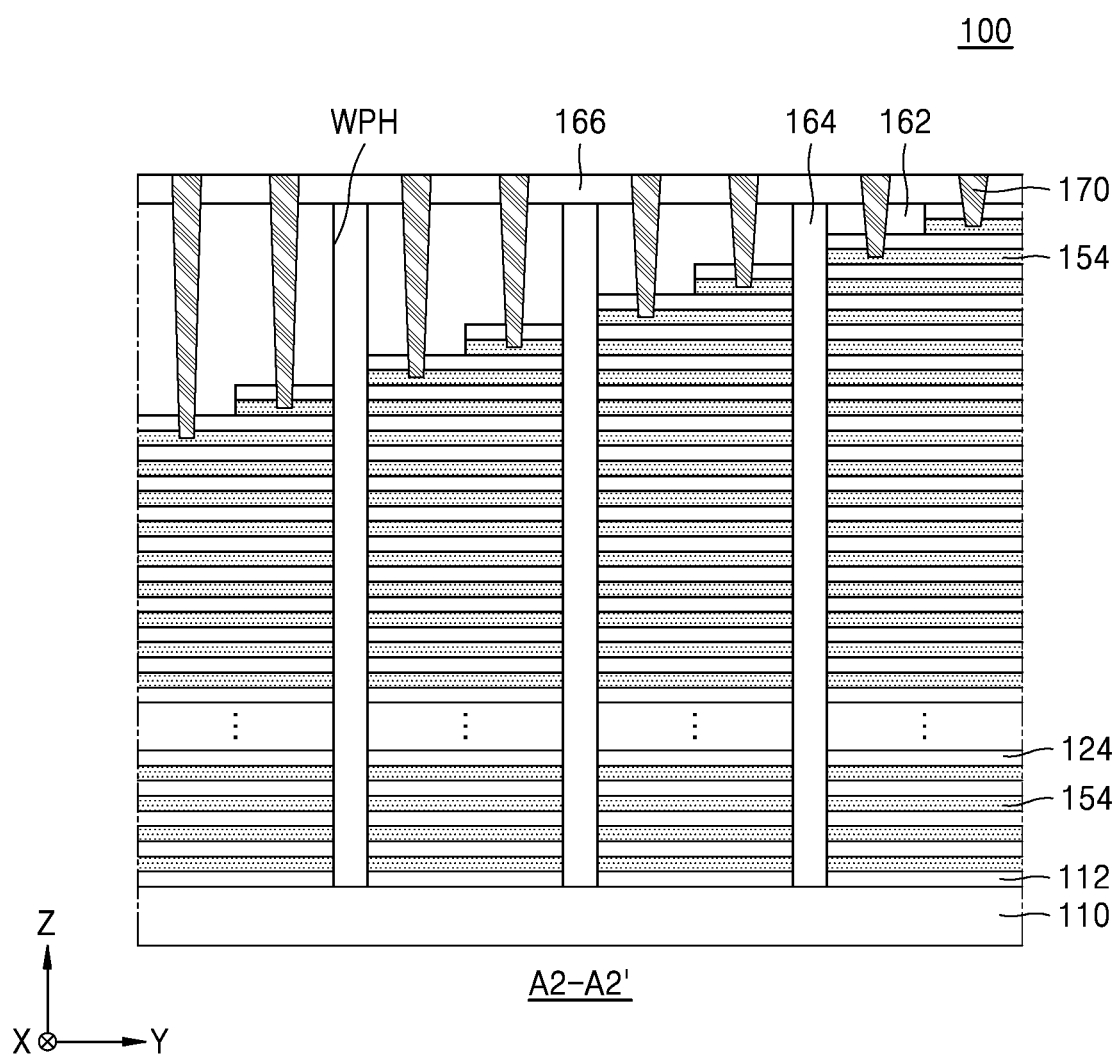
FIG. 4 is a cross-sectional view taken along the line A2-A2' of FIG. 2.
Figure 5:
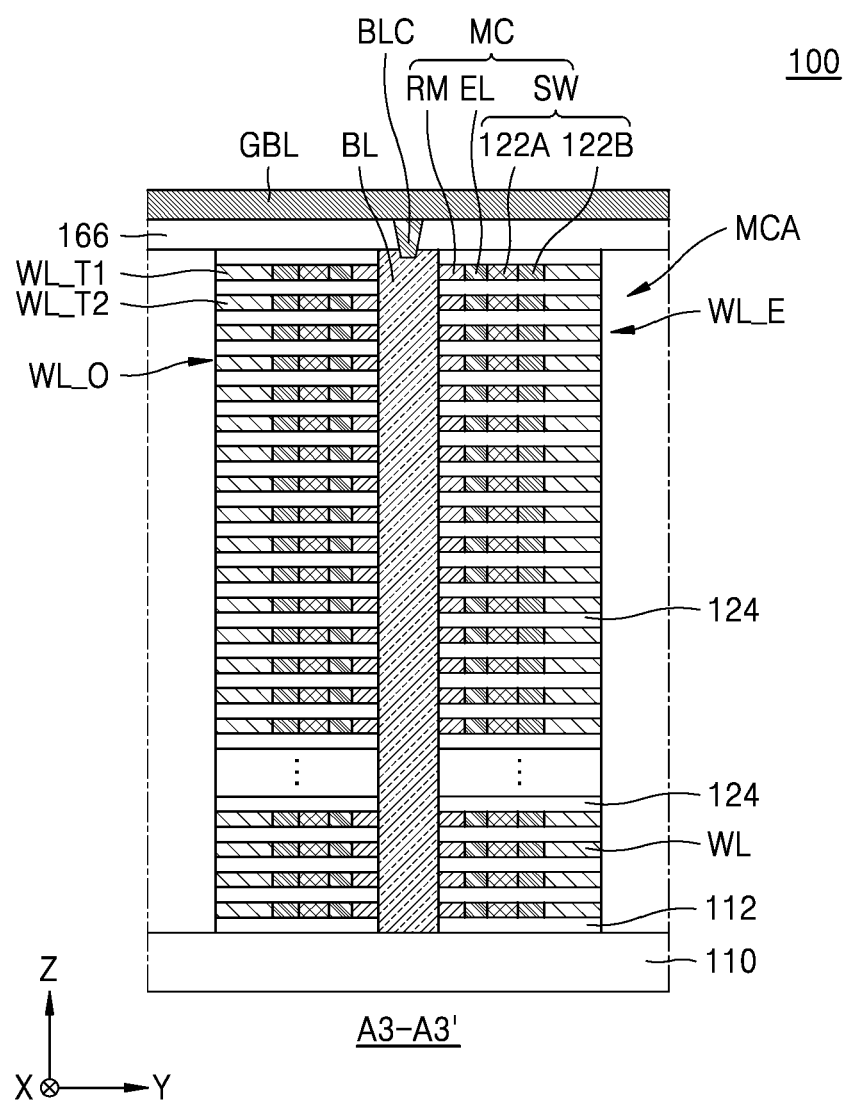
FIG. 5 is a cross-sectional view taken along the line A3-A3' of FIG. 2.
Figure 6:
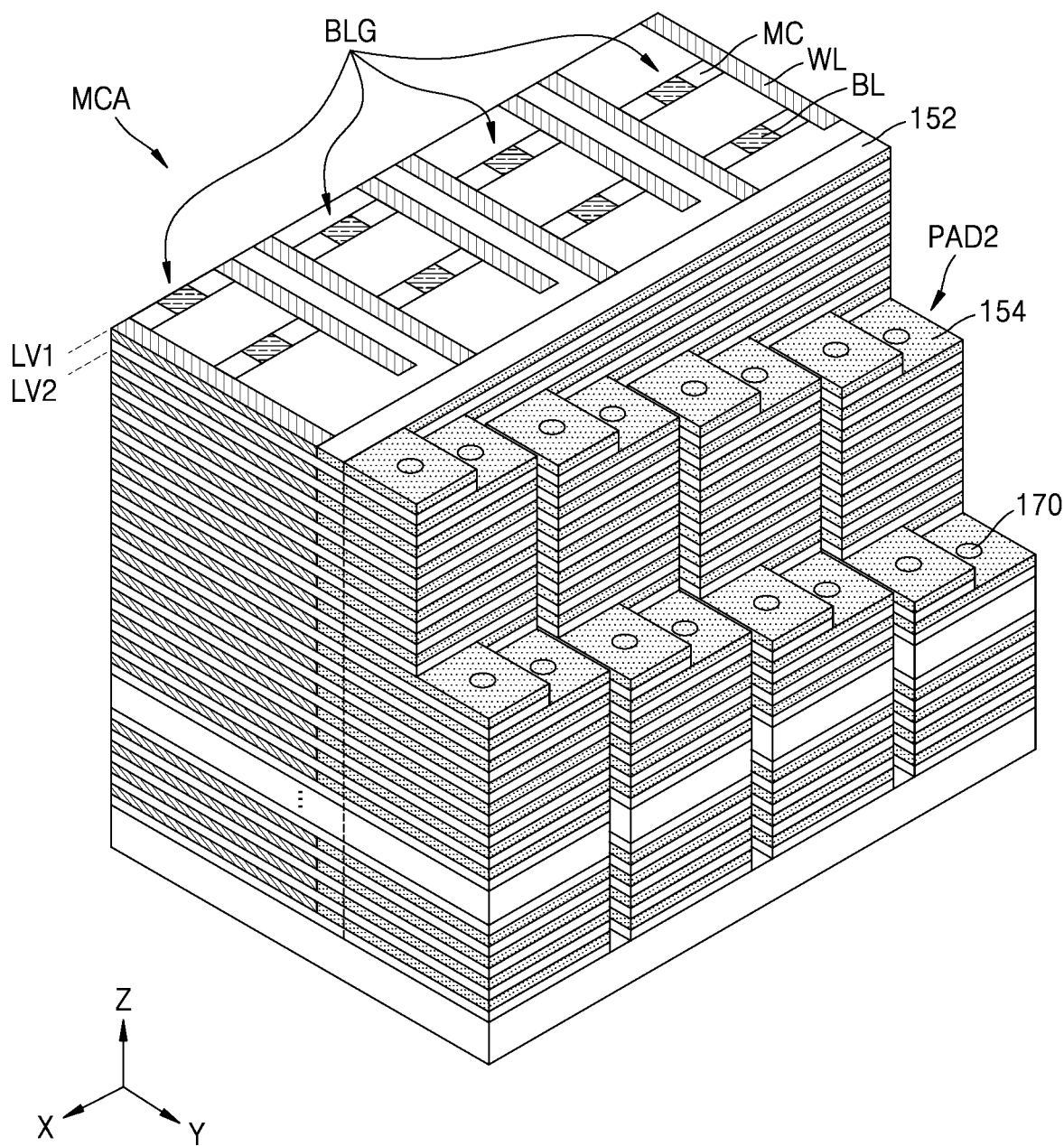
FIG. 6 is a perspective view of the portion B of FIG. 2.
Figure 7:
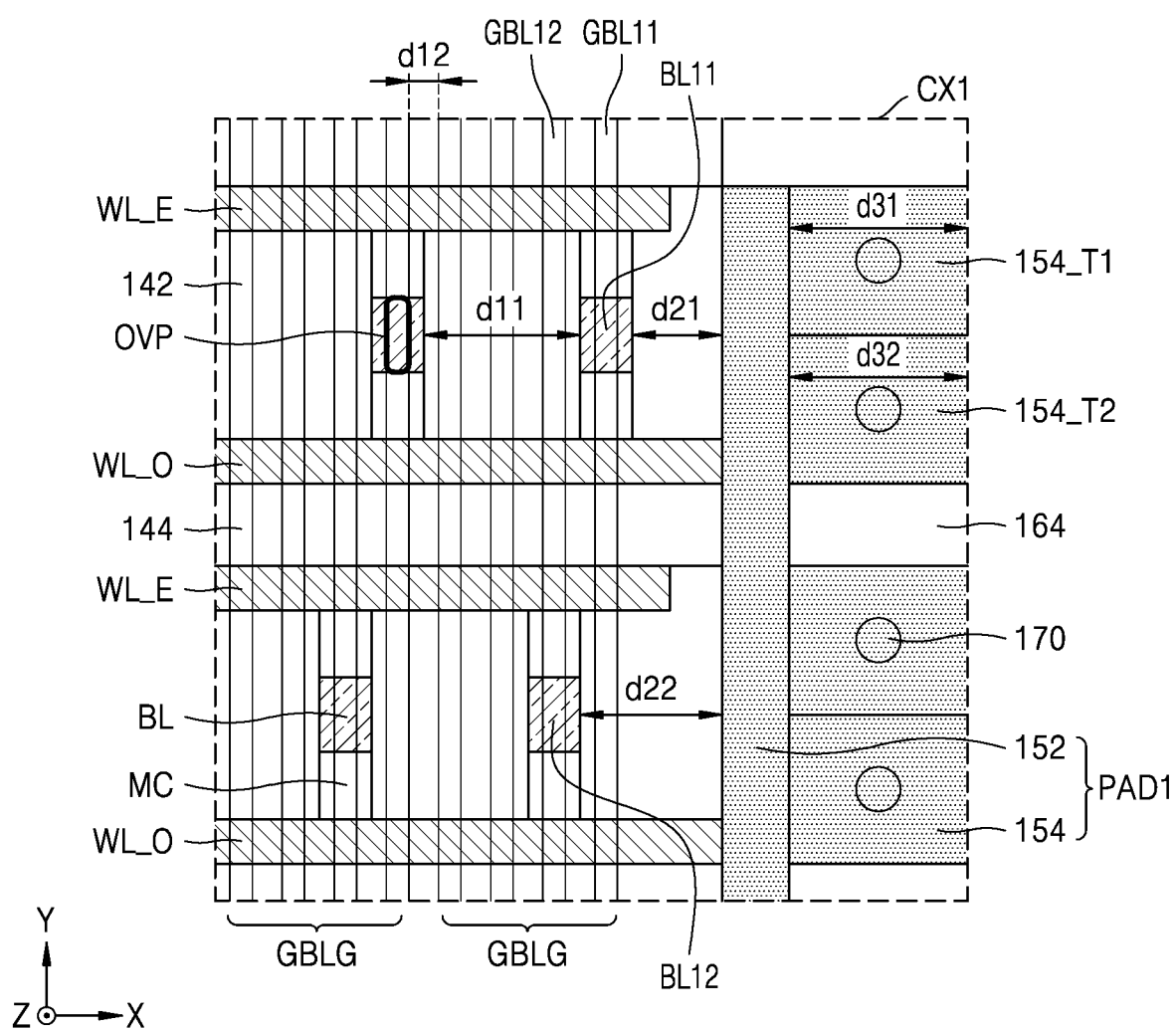
FIG. 7 is a magnified view of the portion CX1 of FIG. 2.
Figure 8A:
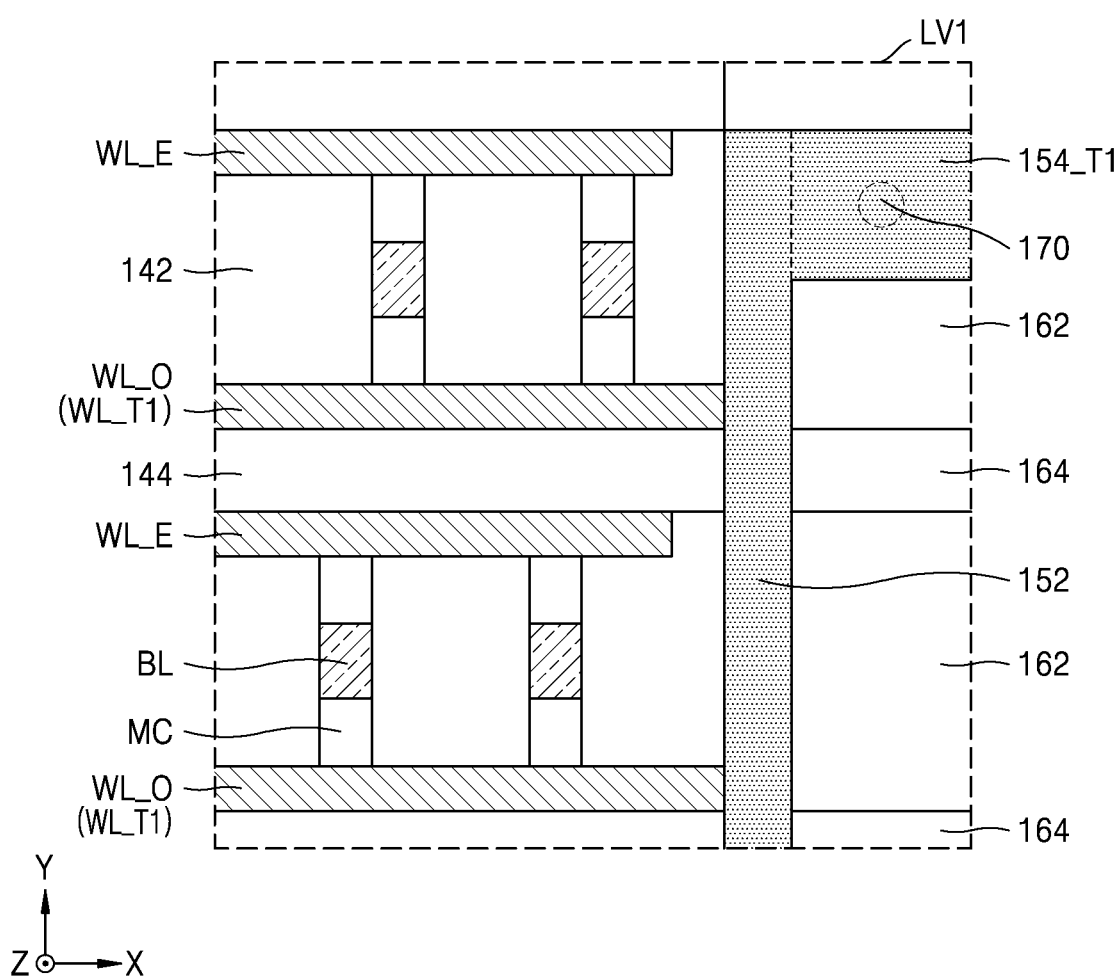
FIGS. 8A and 8B are plan views at the first and second vertical levels of FIG. 6.
Figure 8B:
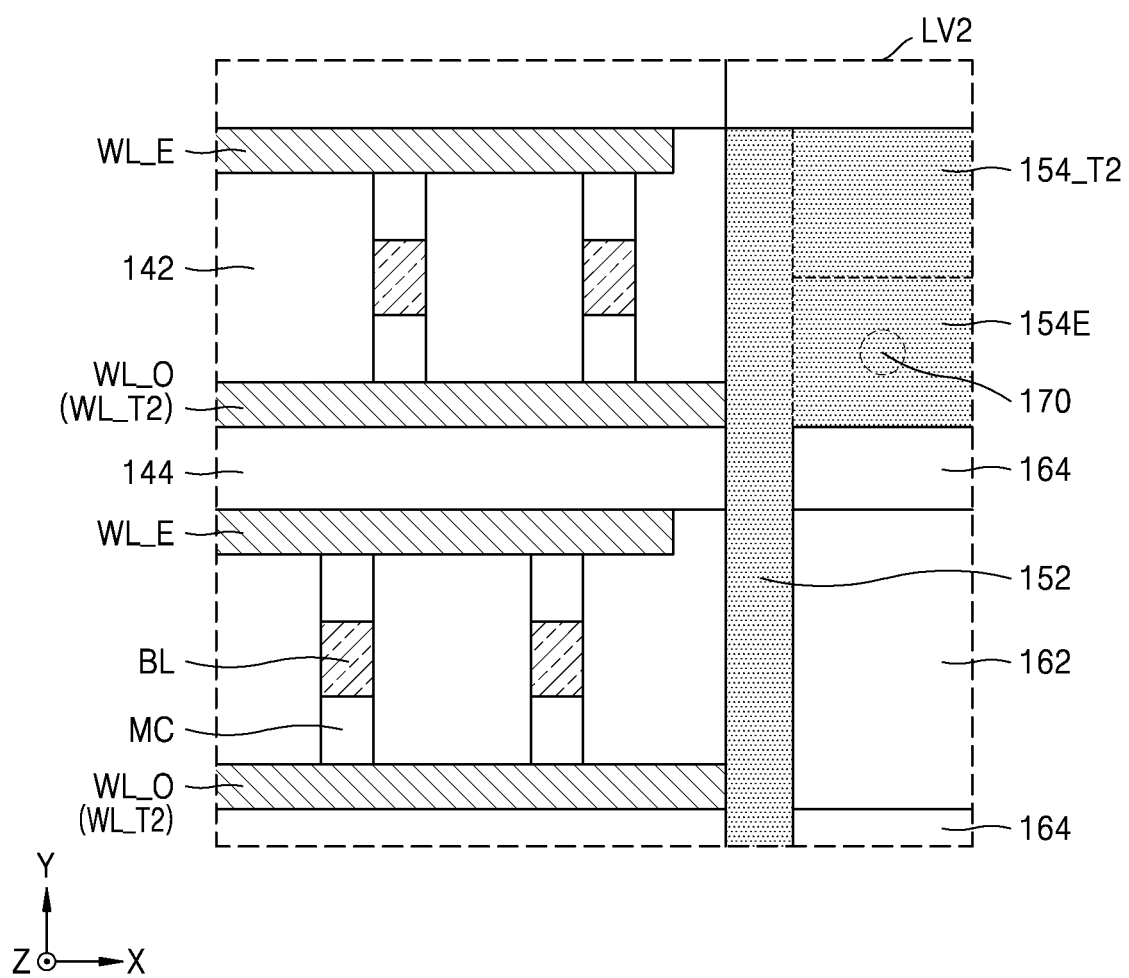

FIG. 2 is a plan view illustrating a schematic configuration of a three-dimensional memory device 100 according to an exemplary embodiment of the present inventive concept. FIG. 3 is a cross-sectional view taken along the line A1-A1' of FIG. 2. FIG. 4 is a cross-sectional view taken along the line A2-A2' of FIG. 2. FIG. 5 is a cross-sectional view taken along the line A3-A3' of FIG. 2. FIG. 6 is a perspective view of the portion B of FIG. 2. FIG. 7 is a magnified view of the portion CX1 of FIG. 2. FIGS. 8A and 8B are plan views at the first and second vertical levels LV1 and LV2 of FIG. 6.

Referring to FIGS. 2 to 8B, a substrate 110 may include a memory cell region MCR, a connection region CON, and a peripheral circuit region PR. In addition, a memory cell array MCA including a plurality of memory cells MC may be arranged in the memory cell region MCR.

In the peripheral circuit region PR, on the substrate 110, a plurality of peripheral circuit transistors TR, which controls (or, e.g., configures) a driving circuit for driving the plurality of memory cells MC, may be formed. For example, the driving circuit may include peripheral circuits capable of processing data input to/output from the plurality of memory cells MC. The peripheral circuits may include, for example, a page buffer, a latch circuit, a cache circuit, a column decoder, a sense amplifier, a data in/output circuit, and a row decoder. For example, the peripheral circuit region PR may be arranged on one side of the memory cell region MCR or may be arranged at a vertical level different from that of the memory cell region MCR to vertically overlap at least a part of the memory cell region MCR.

In the memory cell region MCR, the plurality of memory cells MC may be arranged on the substrate 110. The plurality of memory cells MC may be spaced apart from one another in the vertical direction Z, the first horizontal direction X, and the second horizontal direction Y. Each of the plurality of memory cells MC may include a switching component SW, an electrode layer EL, and a variable resistance memory component RM arranged in the second horizontal direction Y. For example, the switching component SW, the electrode layer EL, and the variable resistance memory component RM may be aligned with one another.

In the memory cell region MCR, a plurality of word lines WL may extend in the second horizontal direction Y and may be arranged on one side of the memory cell MC. A plurality of bit lines BL may extend in the vertical direction Z and may be arranged on one side of the memory cell MC. For example, the plurality of word lines WL may be arranged such that one bit line BL and two memory cells MC are arranged between an odd word line WL_O and an even word line WL_E. For example, the odd word line WL_O, one memory cell MC, the bit line BL, the other memory cell MC, and the even word line WL_E may be arranged sequentially in the second horizontal direction Y.

In the memory cell region MCR, the odd word lines WL_O arranged at the same level in the vertical direction Z are referred to as a first word line group WLG1. A plurality of first word line groups WLG1 may be spaced apart from one another in the vertical direction Z, and for example, the number of odd word lines WL_O included in each of the plurality of first word line groups WLG1 may be 3 to 20. The odd word lines WL_O (for example, the odd word lines WL_O arranged at the same vertical level) included in each of the plurality of first word line groups WLG1 may be connected to one pad layer 154 and may receive the same electrical signal. In addition, even word lines WL_E arranged at the same level in the vertical direction Z are referred to as a second word line group WLG2. A plurality of second word line groups WLG2 may be spaced apart from one another in the vertical direction Z, and for example, the number of even word lines WL_E included in each of the plurality of second word line groups WLG2 may be 3 to 20. The even word lines WL_E (for example, the even word lines WL_E arranged at the same vertical level) included in each of the plurality of second word line groups WLG2 may be connected to one pad layer 154 and may receive the same electrical signal.

In FIG. 2, it is illustrated that the first word line group WLG1 includes four odd word lines WL_O and the second word line group WLG2 includes four even word lines WL_E.

In the memory cell region MCR, a plurality of bit lines BL (for example, four bit lines BL) arranged between odd word lines WL_O, corresponding to one first word line group WLG1, and even word lines WL_E, corresponding to one second word line group WLG2, in the second horizontal direction Y to be offset from one another may be referred to as one bit line group BLG. A plurality of bit line groups BLG may be repeatedly arranged in the first horizontal direction X. Each of the plurality of bit line groups BLG may include bit lines BL arranged in the second horizontal direction Y and may be offset from one another at predetermined intervals. For example, the bit lines BL arranged in the second horizontal direction Y may be misaligned with one another.

For example, as illustrated in FIG. 7, distances by which each of a plurality of bit lines BL included in one bit line group BLG are spaced apart from an end of an odd word line WL_O may be different from one another. For example, a first bit line BL11 included in one bit line group BLG may be spaced apart from an end of an odd word line WL_O by a first distance d21 and a second bit line BL12 included in the one bit line group BLG and adjacent to the first bit line BL11 may be spaced apart from the end of the odd word line WL_O by a second distance d22 greater than the first distance d21.

In the memory cell region MCR, the plurality of global bit lines GBL electrically connected to the plurality of bit lines BL, respectively, may extend on the plurality of bit lines BL in the second horizontal direction Y. The plurality of global bit lines GBL connected to the plurality of bit lines BL included in one bit line group BLG may be referred to as a global bit line group GBLG. The plurality of global bit line groups GBLG may be repeatedly arranged in the first horizontal direction X.

In an exemplary embodiment of the present inventive concept, the number of bit lines BL included in each of the plurality of bit line groups BLG may be 3 to 20 and the number of global bit lines GBL included in each of the plurality of global bit line groups GBLG may be 3 to 20. In addition, the number of global bit lines GBL included in the plurality of bit line groups BLG may be a multiple of the number of odd word lines WL_O corresponding to one first word line group WWI. For example, when the number of odd word lines WL_O corresponding to one first word line group WLG1 is k, the number of global bit lines GBL included in the plurality of bit line groups BLG may be n×k (here, n is a natural number and k is a natural number between 3 and 20).

In an exemplary embodiment of the present inventive concept, an individual voltage (or signal) may be applied to the plurality of bit lines BL included in one bit line group BLG through the plurality of global bit lines GBL corresponding to the plurality of bit lines BL so that the plurality of bit lines BL included in one bit line group BLG may each be independently driven.

For example, as illustrated in FIG. 7, the distances by which the plurality of bit lines BL included in the one bit line group BLG are spaced apart from the end of the odd word line WL_O may be different from one another so that a plurality of overlap positions OVP, in which the plurality of bit lines BL included in the one bit line group BLG overlap the plurality of global bit lines GBL included in the global bit line group GBLG, may be spaced apart from one another in the second horizontal direction Y and the first horizontal direction X. For example, an overlap position OVP, in which the first bit line BL11 included in the one bit line group BLG overlaps a first global bit line GBL11, may be spaced apart from an overlap position OVP, in which the second bit line BL12 included in the one bit line group BLG overlaps a second global bit line GBL12, in the second horizontal direction Y and the first horizontal direction X.

As illustrated in FIG. 7, a distance d11 between two bit lines BL adjacent to each other in the first horizontal direction X among the plurality of bit lines BL (for example, a distance between one bit line BL in one bit line group BLG and one bit line BL in another bit line group BLG, which is adjacent to the one bit line BL in the one bit line group BLG) may be greater than a distance d12 between two adjacent global bit lines GBL in the first horizontal direction X among the plurality of bit lines GBL (for example, a distance between two global bit lines GBL in one global bit line group GBLG). For example, when the number of bit lines BL included in each of the plurality of bit line groups BLG is 3 to 20, a pitch of the bit lines BL may be 3 to 20 times of a pitch of the global bit lines GBL.

As illustrated in FIGS. 4 and 5, in the memory cell region MCR and the connection region CON, a lower insulating layer 112 may be arranged on the substrate 110 and a plurality of insulating layers 124 may be arranged on the lower insulating layer 112. The plurality of insulating layer 124 may be spaced apart from one another in the vertical direction Z. A plurality of word lines W L and a plurality of memory cells MC may be arranged among the plurality of insulating layers 124 in the second horizontal direction Y.

In the memory cell region MCR, a plurality of insulating patterns 142 may extend in the vertical direction Z through the plurality of insulating layers 124. The plurality of insulating patterns 142 may be arranged between two bit lines BL adjacent to each other in the first horizontal direction X and between two memory cells MC adjacent to each other in the first horizontal direction X and may extend in the second horizontal direction Y. In the memory cell region MCR, a buried insulating layer 144 may extend through the plurality of insulating layers 124 in the first horizontal direction X. The buried insulating layer 144 may fill a space between an odd word line WL_O and an even word line WL_E. For example, one side wall of the plurality of word lines WL extending in the first horizontal direction X may contact the plurality of insulating patterns 142 and the other side wall of the plurality of word lines WL extending in the horizontal direction X may contact the buried insulating layer 144.

Each of the plurality of word lines WL, the plurality of bit lines BL, and the plurality of global bit lines GBL may include a metal, a conductive metal nitride, a conductive metal oxide, or a combination of the above materials. For example, each of the plurality of word lines W L, the plurality of bit lines BL, and the plurality of global bit lines GBL may include tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In an exemplary embodiment of the present inventive concept, at least one of the plurality of word lines WL, the plurality of bit lines BL, and the plurality of global bit lines GBL may include a metal layer and a conductive barrier layer with which at least a part of the metal layer is covered. The conductive barrier layer may include, for example, titanium (Ti), titanium nitride (TiN), tantalum (Ta), tantalum nitride (TaN), or a combination of the above metals.

The plurality of memory cells MC may be arranged between the plurality of word lines WL and the plurality of bit lines BL. Each of the plurality of memory cells MC may include a variable resistance memory component RM for storing information, a switching component SW for selecting a memory cell MC, an electrode layer EL arranged between the variable resistance memory component RM and the switching component SW.

The switching component SW may be a current adjustment component configured to control a flow of a current for, for example, a diode element. The switching component SW may include a first junction pattern 122A and a second junction pattern 122B. The first junction pattern 122A and the second junction pattern 122B may have different types of conductivity from each other. In an exemplary embodiment of the present inventive concept, the first junction pattern 122A may have p-type conductivity, and the second junction pattern 122B may have n-type conductivity. In an exemplary embodiment of the present inventive concept, the first junction pattern 122A may have n-type conductivity, and the second junction pattern 122B may have p-type conductivity. In an exemplary embodiment of the present inventive concept, the switching component SW may include an amorphous chalcogenide switching material having an ovonic threshold switching (OTS) characteristic.

The electrode layer EL may include a conductive material configured to generate heat such that a phase of the variable resistance memory component RM may change. For example, the electrode layer EL may include a high melting point metal such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination of the above metals, a nitride of the above metals, or a carbon conductive material. However, a material of the electrode layer EL is not limited to the above materials. In an exemplary embodiment of the present inventive concept, the electrode layer EL may include a conductive layer including a metal, a conductive metal nitride, or a conductive metal oxide and at least one conductive barrier layer with which at least a part of the conductive layer is covered. For example, the conductive barrier layer may include a metal oxide, a metal nitride, or a combination of the above materials. However, the present inventive concept is not limited thereto.

The variable resistance memory component RM may include a phase change material reversibly changing between an amorphous state and a crystalline state in accordance with a heating time. For example, the variable resistance memory component RM may have a phase that may reversibly change by Joule heat generated by a voltage applied to both ends thereof and may include a material of which resistance may change by such a phase change. For example, the phase change material may be in a high resistance state in an amorphous phase and may be in a low resistance state in a crystalline phase. By defining the high resistance state as "0" and the low resistance state as "I", data may be stored in the variable resistance memory component RM.

In an exemplary embodiment of the present inventive concept, the variable resistance memory component RM may include a single layer or a multilayer including a material selected from binary materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, ternary materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, quaternary materials such as GeSbTeS, BiSbTeSe, AgInSbTe, GeSb-SeTe, GeSnSbTe, SiGeSbTe. SiGeSbSe, SiGeSeTe, BiGe-SeTe, BiSiGeSe, BiSiGeTe, GeSbTeBi, GeSbSeBi, GeSb-SeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe. and NdGeSbS, and quinary materials such as InSbTeAsSe, GeScSbSeTe, GeSbSeTeS, GeScSbSeS, GeScSbTeS, GeScSeTeS, GeScSbSeP, GeScSbTeP, GeSb-SeTeP, GeScSbSeIn, GeScSbSeGa, GeScSbSeAl, GeScSb-SeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSb-SeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In an exemplary embodiment of the present inventive concept, the variable resistance memory component RM may include a material selected from the above binary, ternary, quaternary, and quinary materials and at least one additional element selected from boron (B), carbon (C), nitrogen (N), oxygen (O), phosphorus (P), cadmium (Cd), W, Ti, hafnium (Hf), and Zr.

In the above, the phase change material is illustrated as the variable resistance memory component RM. However, the present inventive concept is not limited thereto and the variable resistance memory component RM may include various materials having a resistance change characteristic based on a change of phase of the various materials.

In an exemplary embodiment of the present inventive concept, when the variable resistance memory component RM includes a transition metal oxide, the three-dimensional memory device 100 may be resistive random access memory (ReRAM). For example, in the variable resistance memory component RM including a transition metal oxide, at least one electrical path may be generated in or vanished from the variable resistance memory component RM by a programming operation. When the electrical path is generated, the variable resistance memory component RM may have a small resistance value and, when the electrical path is vanished, the variable resistance memory component RM may have a large resistance value. The three-dimensional memory device 100 may store data by using such a change in resistance value of the variable resistance memory component RM.

When the variable resistance memory component RM includes a transition metal oxide, the transition metal oxide may include at least one of Ta, Zr, Ti, Hf, manganese (Mn), yttrium (Y), Ni, Co, Zn, niobium (Nb), Cu, iron (Fe), and/or Cr. For example, the transition metal oxide may include a single layer or a multilayer including at least one of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and/or $Fe_2O_{3-x}$. In the above materials, x and y may be respectively in ranges of about $0 \leq x \leq$ about 1.5 and about $0 \leq y \leq$ about 0.5. However, the present inventive concept is not limited thereto.

In an exemplary embodiment of the present inventive concept, the three-dimensional memory device 100 may include magnetic RAM (MRAM) when the variable resistance memory component RM has a magnetic tunnel junction (MTJ) structure including two electrodes including, for example, a magnetic material and a dielectric material interposed between the two magnetic electrodes.

The two electrodes may be, respectively, a magnetized fixed layer and a magnetized free layer. The dielectric material interposed between the magnetized fixed layer and the magnetized free layer may be a tunnel barrier layer. The magnetized fixed layer may have a magnetization direction fixed in one direction, and the magnetized free layer may have a magnetization direction that may change to be parallel or antiparallel with the magnetization direction of the magnetized fixed layer. The magnetization directions of the magnetized fixed layer and the magnetized free layer may be parallel with one side of the tunnel barrier layer. However, the present inventive concept is not limited thereto. The magnetization directions of the magnetized fixed layer and the magnetized free layer may be perpendicular to one side of the tunnel barrier layer.

When the magnetization direction of the magnetized free layer is parallel with that of the magnetized fixed layer, the variable resistance memory component RM may have a first resistance value. In addition, when the magnetization direction of the magnetized free layer is antiparallel with that of the magnetized fixed layer, the variable resistance memory component RM may have a second resistance value. The three-dimensional memory device 100 may store data by using such a difference between the first resistance value and the second resistance value of the variable resistance memory component RM. The magnetization direction of the magnetized free layer may be changed by spin torque of electrons in a program current.

The magnetized fixed layer and the magnetized free layer may include a magnetic material. In addition, the magnetized fixed layer may further include a diamagnetic material fixing a magnetization direction of a ferromagnetic material in the magnetized fixed layer. The tunnel barrier layer may include oxide of one material selected from Mg, Ti, Al, MgZn, and MgB. However, the present inventive concept is not limited thereto.

As illustrated in FIG. 2, a first pad structure PAD1 and a second pad structure PAD2 may be arranged in the connection region CON. The first pad structure PAD1 may be arranged on one side (e.g., a first side) of the memory cell region MCR, and may be connected to one first word line group WLG1 (e.g., odd word lines WL_O). The second pad structure PAD2 may be arranged on the other side (e.g., a second side opposite the first side) of the memory cell region MCR, and may be connected to one second word line group WLG2 (e.g., even word lines WL_E).

The first pad structure PAD1 and the second pad structure PAD2 may function as connection terminals for applying electrical signals to the odd word lines WL_O and the even word lines WL_E, respectively. For example, a common signal or voltage may be applied to one first word line group WLG1 or odd word lines WL_O arranged at the same vertical level through the first pad structure PAD1. A common signal or voltage may be applied to one second word line group WLG2 or even word lines WL_E arranged at the same vertical level through the second pad structure PAD2.

The first pad structure PAD1 may include a plurality of connection units 152 and a plurality of pad layers 154. The plurality of connection units 152 and the plurality of pad layers 154 may be spaced apart from each other in the vertical direction Z.

In an exemplary embodiment of the present inventive concept, the plurality of connection units 152 are spaced apart from one another in the vertical direction Z, and extend in the second horizontal direction Y. In addition, the plurality of connection units 152 are commonly connected to odd word lines WL_O included in one first word line group WLG1. For example, in FIG. 2, it is illustrated that each of the plurality of connection units 152 is commonly connected to four odd word lines WL_O arranged at the same vertical level as each of the plurality of connection units 152.

The plurality of pad layers 154 may extend from the plurality of connection units 152 in the first horizontal direction X. The plurality of pad layers 154 may be arranged to have a smaller length away from an upper surface of the substrate 110. For example, the pad layer 154 connected to the uppermost word line WL_T1 (refer to FIG. 5) may have a length smaller than that of the pad layer 154 connected to the lowermost word line W L. Each of the plurality of pad layers 154 may include a pad surface 154E (refer to FIG. 8B), and the pad surface 154E of one pad layer 154 may refer to a portion on which a pad layer 154 arranged at a vertical level higher than that of the one pad layer 154 is not arranged. A plurality of contact plugs 170 may be respectively arranged on the pad surfaces 154E of the plurality of pad layers 154.

In an exemplary embodiment of the present inventive concept, the plurality of pad layers 154 may form a staircase shape in the first horizontal direction X and the second horizontal direction Y. For example, a pad surface 154E of a pad layer 154 connected to odd word lines WL_O included in one first word line group WLG1 may be spaced apart from a pad surface 154E of a pad layer 154 connected to other odd word lines WL_O included in another first word line group WLG1 adjacent to the one first word line group WLG1 in the second horizontal direction Y. For example, the pad surface 154E of the pad layer 154_T1 connected to the uppermost word line WL_T1 (refer to FIG. 5) may be spaced apart from a pad surface 154E of a pad layer 154_T2 connected to a second uppermost word line WL_T2 (refer to FIG. 5) in the second horizontal direction Y. For example, the pad surface 154E of the pad layer 154_T1 may be spaced apart from the pad surface 154E of the pad layer 154_T2 in the vertical direction Z.

In addition, the pad layer 154 connected to the odd word lines WL_O included in the one first word line group WLG1 is spaced apart from a corresponding connection unit 152 in the first horizontal direction X by a first distance d31. The pad layer 154 connected to the other odd word lines WL_O included in the other first word line group WLG1 adjacent to the one first word line group WLG1 is spaced apart from a corresponding connection unit 152 in the first horizontal direction X by a second distance d32, and the second distance d32 is substantially equal to the first distance d31. For example, as illustrated in FIG. 7, an edge of the pad layer 154_T1 connected to the uppermost word line WL_T1 is spaced apart from a corresponding connection unit 152 in the first horizontal direction X by the first distance d31, and an edge of the pad layer 154_T2 connected to the second uppermost word line WL_T2 is spaced apart from a corresponding connection unit 152 in the first horizontal direction X by the second distance d32, and the second distance d32 is substantially equal to the first distance d31.

The second pad structure PAD2 may include the plurality of connection units 152 and the plurality of pad layers 154. Each of the plurality of connection units 152 extends in the second horizontal direction Y and is connected to even word lines WL_E included in one second word line group WLG2. For example, in FIG. 2, it is illustrated that each of the plurality of connection units 152 is commonly connected to four even word lines WL_E arranged at the same vertical level as each of the plurality of connection units 152. The plurality of pad layers 154 may extend from the plurality of connection units 152 in the first horizontal direction X.

The plurality of insulating layers 124 may extend from the memory cell region MCR to the connection region CON and each of the plurality of pad layers 154 may be arranged between two adjacent insulating layers 124 among the plurality of insulating layers 124. A cover insulating layer 162 may be arranged on the plurality of pad layers 154. The cover insulating layer 162 may be arranged to cover the plurality of pad layers 154 having a staircase shape.

At least one of both ends of each of the plurality of pad layers 154 in the second horizontal direction Y may contact an isolation insulating layer 164. For example, the plurality of isolation insulating layers 164 may be arranged in a plurality of pad isolation openings WPH passing through the plurality of pad layers 154 and the cover insulating layer 162, and may extend in the first horizontal direction X. For example, when a distance between two adjacent pad isolation openings WPH may be twice a width of a pad surface 154E in the second horizontal direction Y and two contact plugs 170 may be arranged between the two adjacent pad isolation openings WPH in the second horizontal direction Y. However, the present inventive concept is not limited thereto.

An upper insulating layer 166 may be arranged on the cover insulating layer 162 and the plurality of isolation insulating layers 164. For example, the upper insulating layer 166 may cover the cover insulating layer 162 and the plurality of isolation insulating layers 164. In the connection region CON, the plurality of contact plugs 170 connected to the plurality of pad layers 154 may be arranged through the upper insulating layer 166.

In the memory cell region MCR, a bit line contact BLC connecting a global bit line GBL to a bit line BL may be arranged through the upper insulating layer 166. However, in an exemplary embodiment of the present inventive concept, an additional stud may be arranged between the global bit line GBL and the bit line contact BLC. In addition, in an exemplary embodiment of the present inventive concept, the bit line contact BLC may be omitted and a bottom surface of the global bit line GBL may directly contact an upper surface of the bit line BL.

In general, the three-dimensional memory device has a structure in which a plurality of word lines are arranged in a vertical direction and a plurality of bit lines extending in the vertical direction are connected to one global bit line. The above structure may provide density increases because a plurality of memory cells may be arranged in the vertical direction, and an area of a pad formation region may increase because a plurality of pads, which are for electrical connection to the plurality of memory cells or word lines that are arranged in the vertical direction, have a staircase shape extending in one direction. For example, because the area of the pad formation region is relatively large, an area of a memory cell region may be reduced.

However, in the above-described exemplary embodiments, one global bit line group GBLG connected to one bit line group BLG includes a plurality of global bit lines GBL spaced apart from one another, and a plurality of word lines WL included in one word line group WLG1 and WGL2 are connected to one another by a connection unit 152 and share one pad layer 154. Therefore, an area of the connection region CON for forming the pad layer 154 may be reduced so that density of the three-dimensional memory device 100 may increase.

Figure 9:
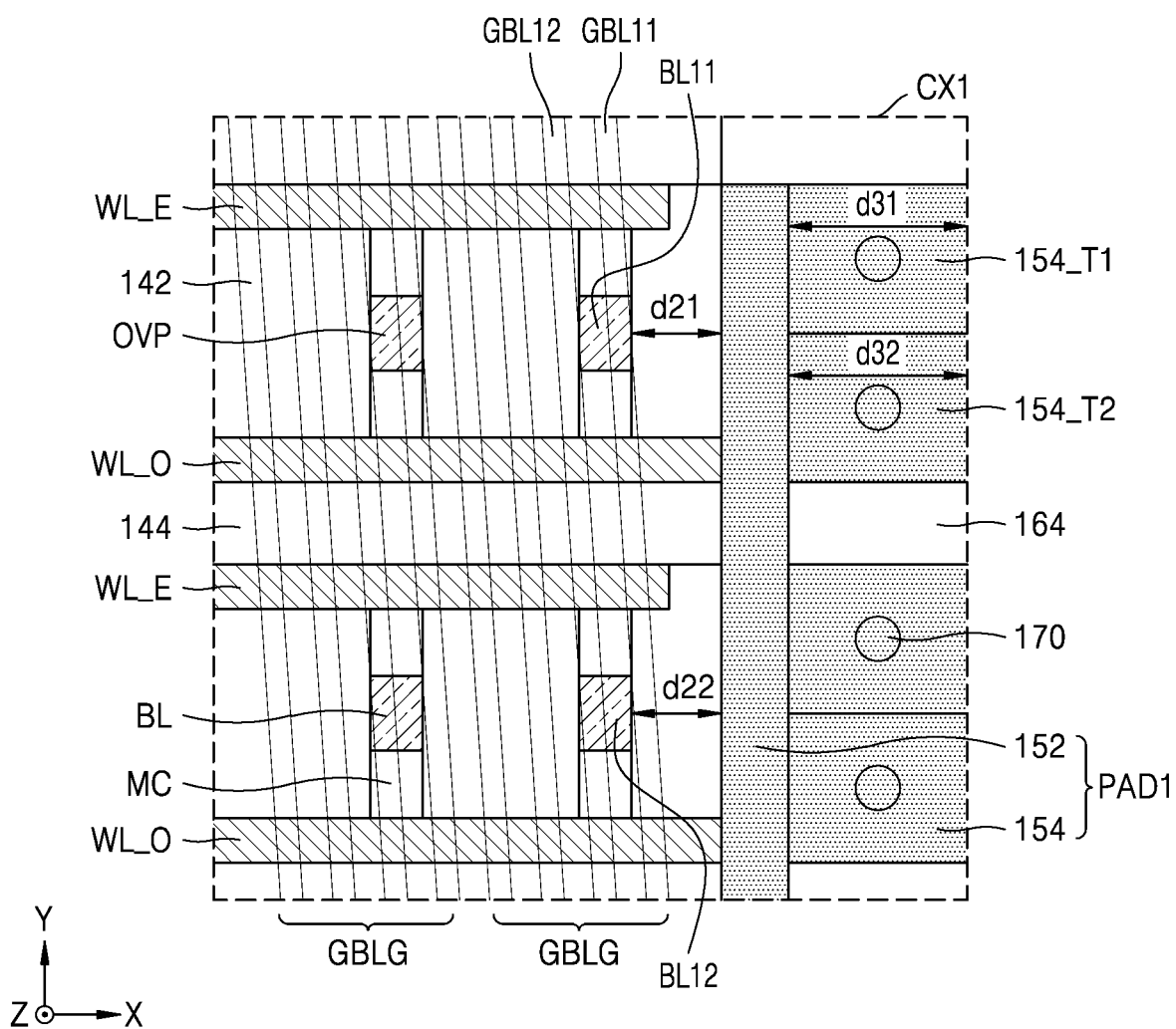
FIG. 9 is a plan view illustrating a three-dimensional memory device according to an exemplary embodiment of the present inventive concept.

FIG. 9 is a plan view illustrating a three-dimensional memory device 100A according to an exemplary embodiment of the present inventive concept. FIG. 9 corresponds to an enlarged view of the portion CX1 of FIG. 2.

Referring to FIG. 9, a distance d11 between two bit lines BL adjacent to each other in the first horizontal direction X among the plurality of bit lines BL (For example, a distance between one bit line BL in one bit line group BLG and one bit line BL in another bit line group BLG, which is adjacent to the one bit line BL in the one bit line group BLG) may be greater than a distance d12 between two global bit lines GBL adjacent to each other in the first horizontal direction X among the plurality of bit lines GBL (For example, a distance between two global bit lines GBL in one global bit line group GBLG).

From a plan view, the plurality of global bit lines GBL may be inclined (or, e.g., slanted) at an inclination angle of, for example, about 1 degree to about 20 degrees with respect to the second horizontal direction Y. However, the present inventive concept is not limited thereto. For example, the inclination angle may vary in accordance with a size and pitch of each of the plurality of bit lines BL and the plurality of memory cells MC.

For example, distances between a plurality of bit lines BL included in one bit line group BLG an end of an odd word line WL_O may be equal to one another so that a plurality of overlap positions OVP in which the plurality of bit lines BL included in the one bit line group BLG overlap a plurality of global bit lines GBL included in one global bit line group GBLG may overlap in the first horizontal direction X. For example, an overlap position OVP, in which a first bit line BL11 included in one bit line group BLG overlaps a first global bit line GBL11, may overlap and be spaced apart from an overlap position OVP, in which a second bit line BL12 included in the one bit line group BLG and adjacent to the first bit line BL11 (in the second horizontal direction Y) overlaps a second global bit line GBL12, in the first horizontal direction X and the second horizontal direction Y, respectively.

Figure 10:
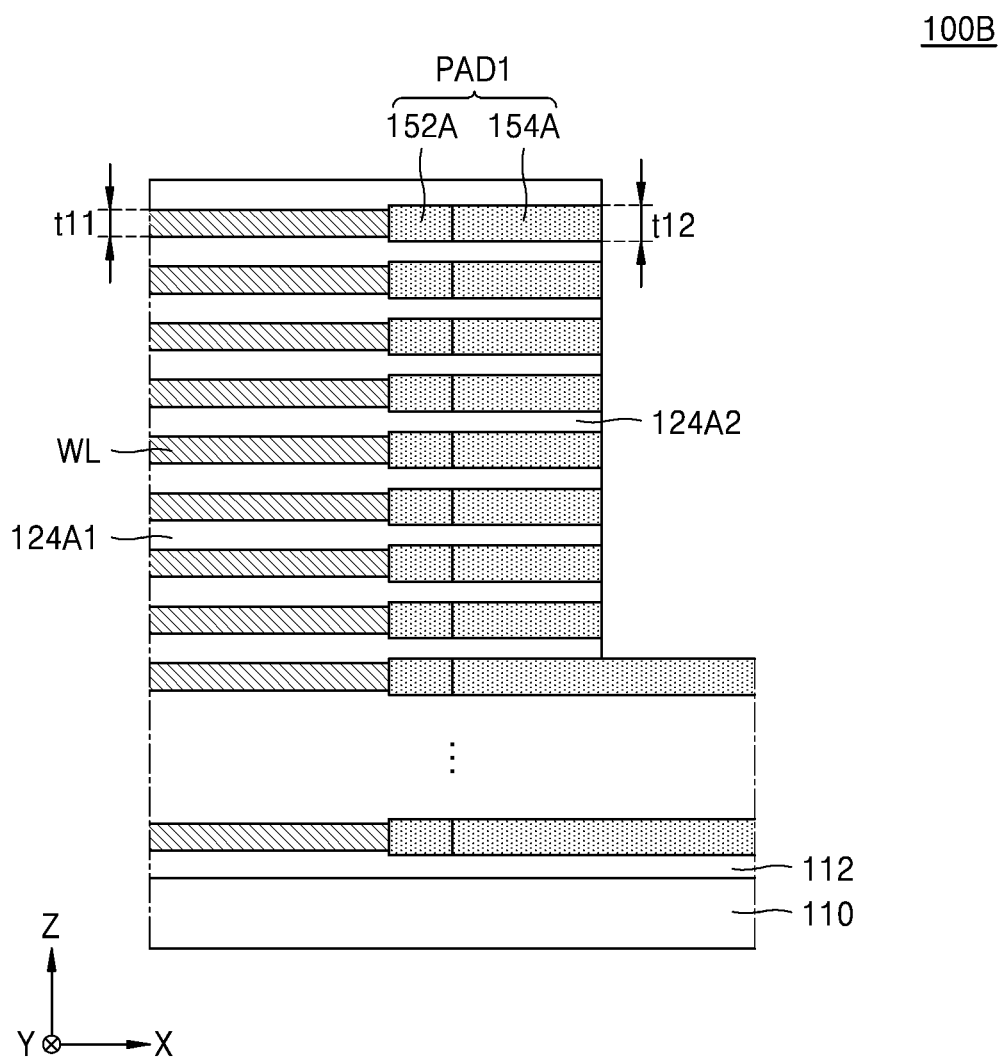
FIG. 10 is a cross-sectional view illustrating a three-dimensional memory device according to an exemplary embodiment of the present inventive concept.

FIG. 10 is a cross-sectional view illustrating a three-dimensional memory device 100B according to an exemplary embodiment of the present inventive concept.

Referring to FIG. 10, each of a plurality of word lines WL may have a first thickness t11, and each of a plurality of connection units 152A and each of a plurality of pad layers 154A may have a second thickness t12 in the vertical direction Z. The second thickness t12 may be greater than the first thickness t11, and an insulating layer 124A2 arranged between the plurality of connection units 152A and between the plurality of pad layers 154A may have a substantially constant thickness. An insulating layer 124A1 arranged between the plurality of word lines WL may have a thickness greater than the thickness of the insulating layer 124A2 arranged between the plurality of connection units 152A and between the plurality of pad layers 154A. For example, in a process of forming the plurality of connection units 152A and the plurality of pad layers 154A by removing a plurality of sacrificial layers 122 (See, e.g., FIG. 12B), by removing the plurality of sacrificial layers 122 and then, further etching an exposed insulating layer 124 by a partial thickness, the plurality of connection units 152A and the plurality of pad layers 154A may be formed to be thicker than the plurality of word lines WL.

Figure 11:
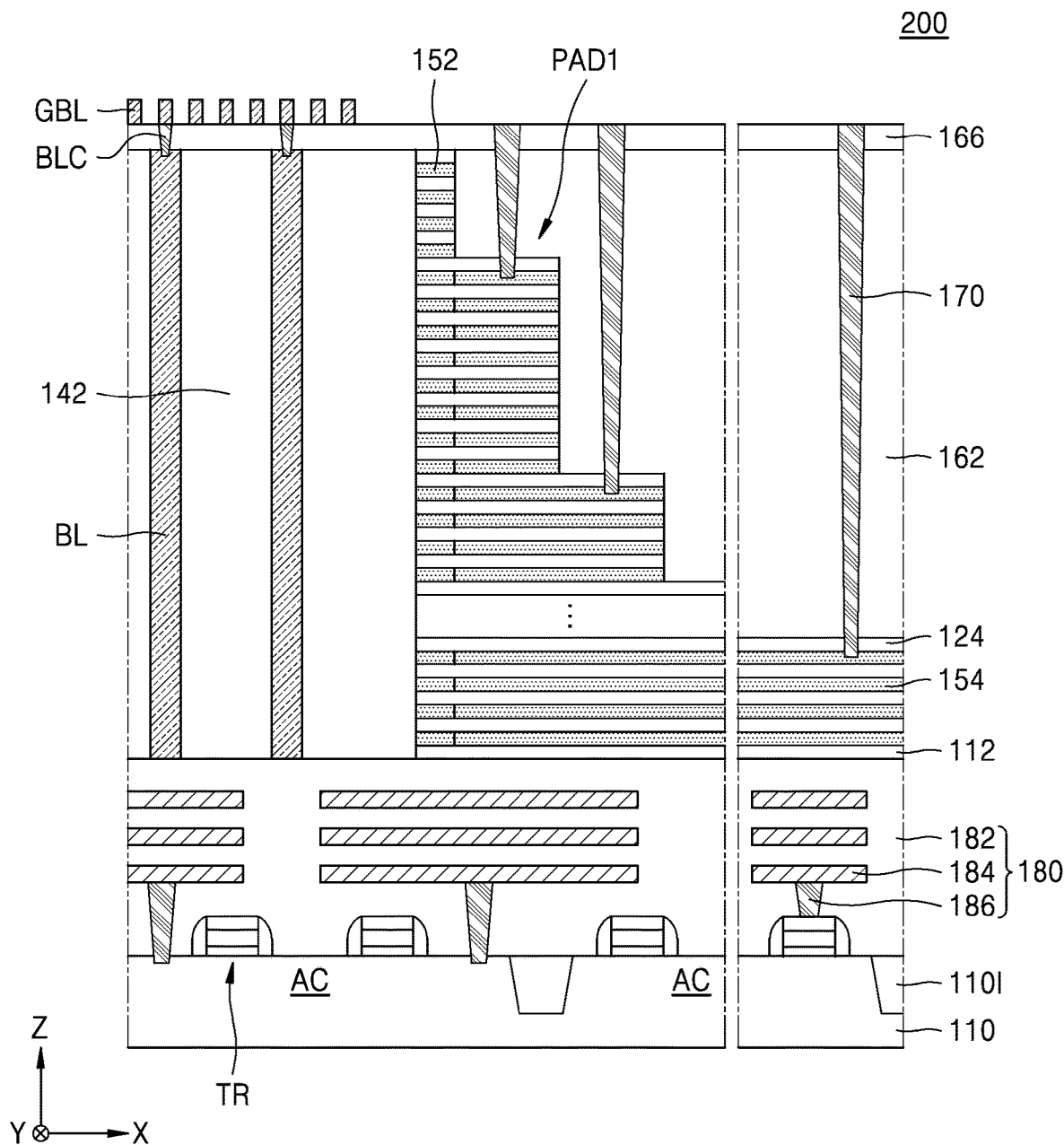
FIG. 11 is a cross-sectional view illustrating a three-dimensional memory device according to an exemplary embodiment of the present inventive concept.

FIG. 11 is a cross-sectional view illustrating a three-dimensional memory device 200 according to an exemplary embodiment of the present inventive concept. FIG. 11 is a cross-sectional view taken along the line A1-A1' of FIG. 2.

Referring to FIG. 11, the three-dimensional memory device 200 may include a peripheral circuit transistor TR, a lower structure 180, a memory cell array MCA (refer to FIG. 5), and pad structures PAD1 and PAD2. The peripheral circuit transistor TR may be formed on a substrate 110. In an exemplary embodiment of the present inventive concept, the three-dimensional memory device 200 may have a cell over periphery (COP) structure in which the memory cell array MCA is arranged on the peripheral circuit transistor TR.

A device isolation layer 1101 defining an active region AC may be formed on the substrate 110, and the peripheral circuit transistor TR may be formed on the active region AC of the substrate 110. An impurity region doped with impurities may be formed in a part of the active region AC.

The peripheral circuit transistor TR may, for example, control (e.g., configure) a driving circuit for driving the memory cell array MCA. For example, the driving circuit may include peripheral circuits capable of processing data input to/output from the memory cell array MCA. The peripheral circuits may include, for example, a page buffer, a latch circuit, a cache circuit, a column decoder, a sense amplifier, a data in/output circuit, and/or a row decoder.

The lower structure 180 may be arranged on the substrate 110 and may cover the peripheral circuit transistor TR. The lower structure 180 may include an insulating layer 182, wiring layers 184, and a contact 186 arranged on the substrate 110. A plurality of memory cells MC (refer to FIG.

5), a plurality of word lines WL (refer to FIG. 5), and a plurality of bit lines BL may be arranged on the lower structure 180.

In FIG. 11, it is illustrated that the peripheral circuit transistor TR is formed on the substrate 110. In addition, the pad structures PAD1 and PAD2 are arranged at a vertical level higher than that of the peripheral circuit transistor TR and have a smaller length as a distance from an upper surface of the substrate 110 increases. However, in an exemplary embodiment of the present inventive concept, instead of forming the peripheral circuit transistor TR on the substrate 110, the peripheral circuit transistor TR may be formed on an additional substrate, and the additional substrate may be attached to the substrate 110 on which the memory cell array MCA is formed so that the peripheral circuit transistor TR and the memory cell array MCA may be arranged between the additional substrate and the substrate 110. In such a case, the pad structures PAD1 and PAD2 may be arranged at a vertical level higher than that of the peripheral circuit transistor TR to have a greater length upward.

Figure 19:
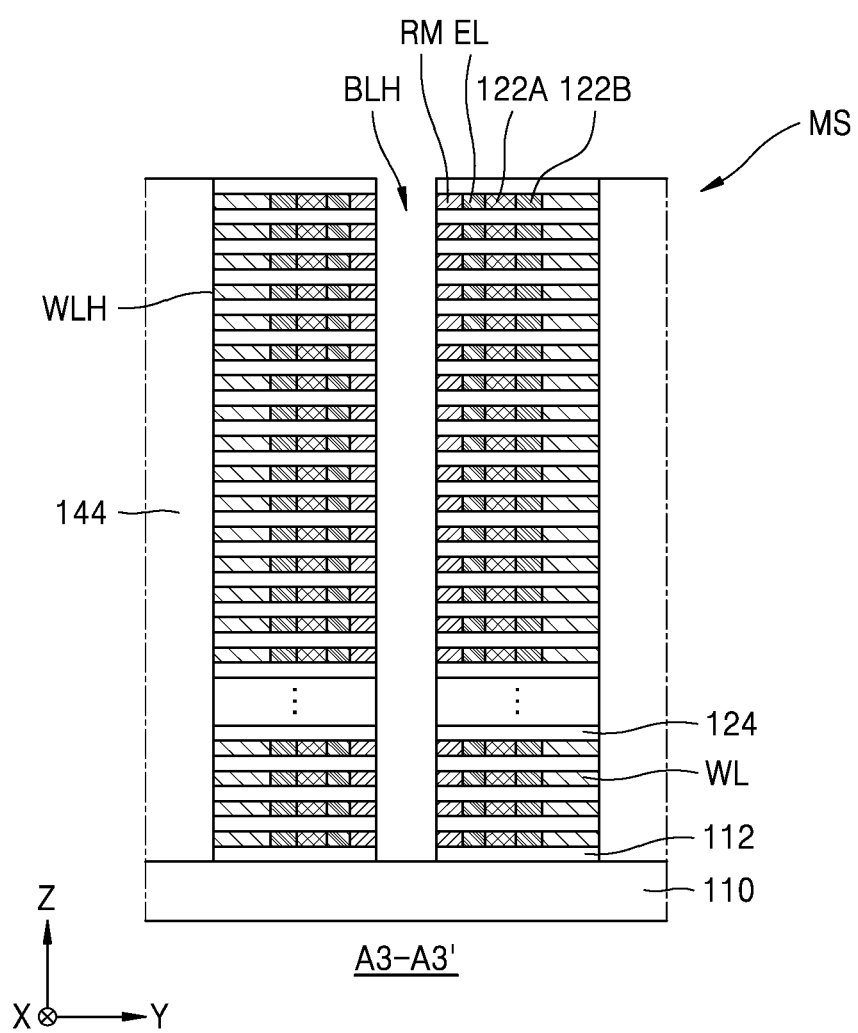
Figure 20A:
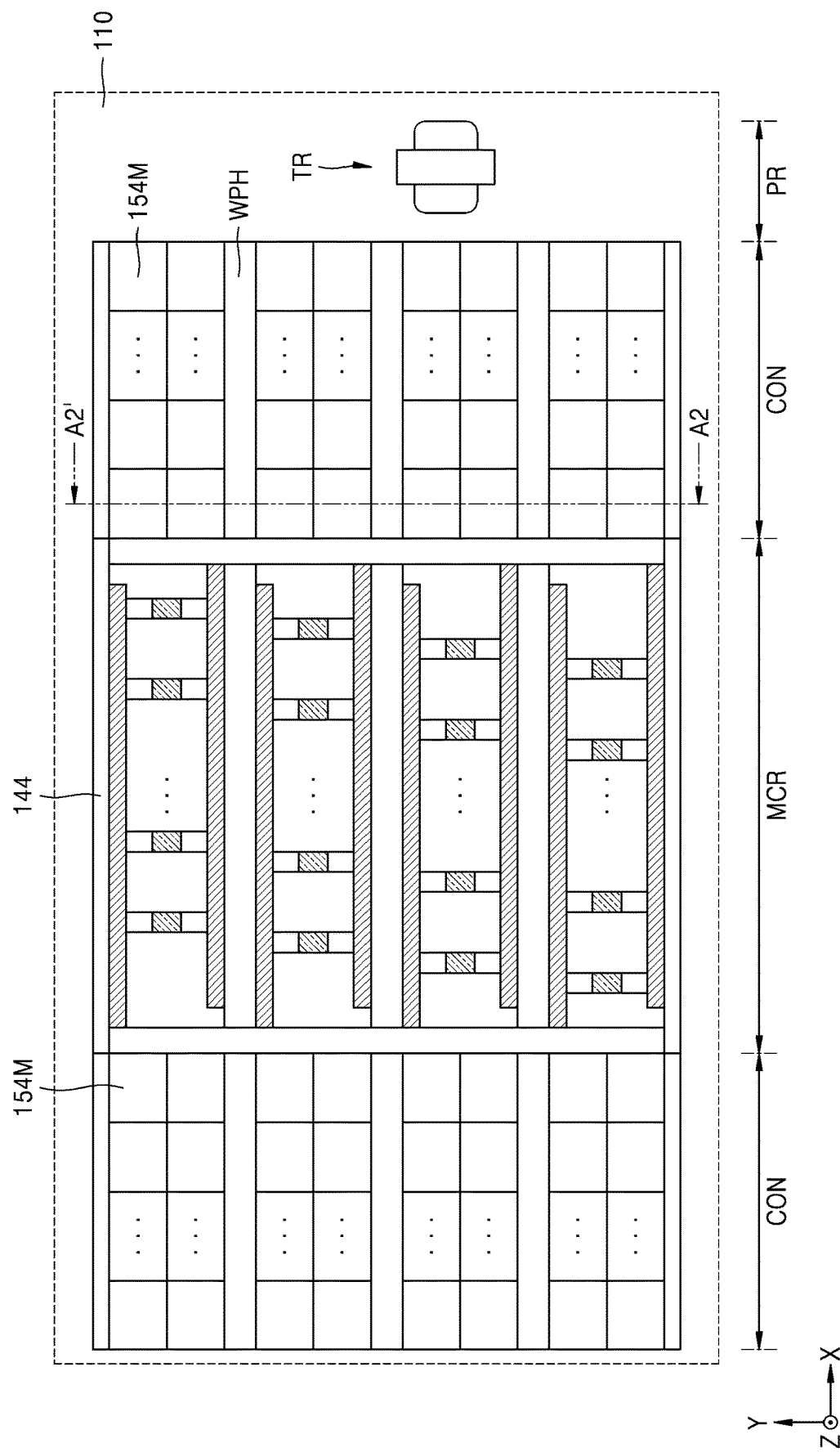
Figure 20B:
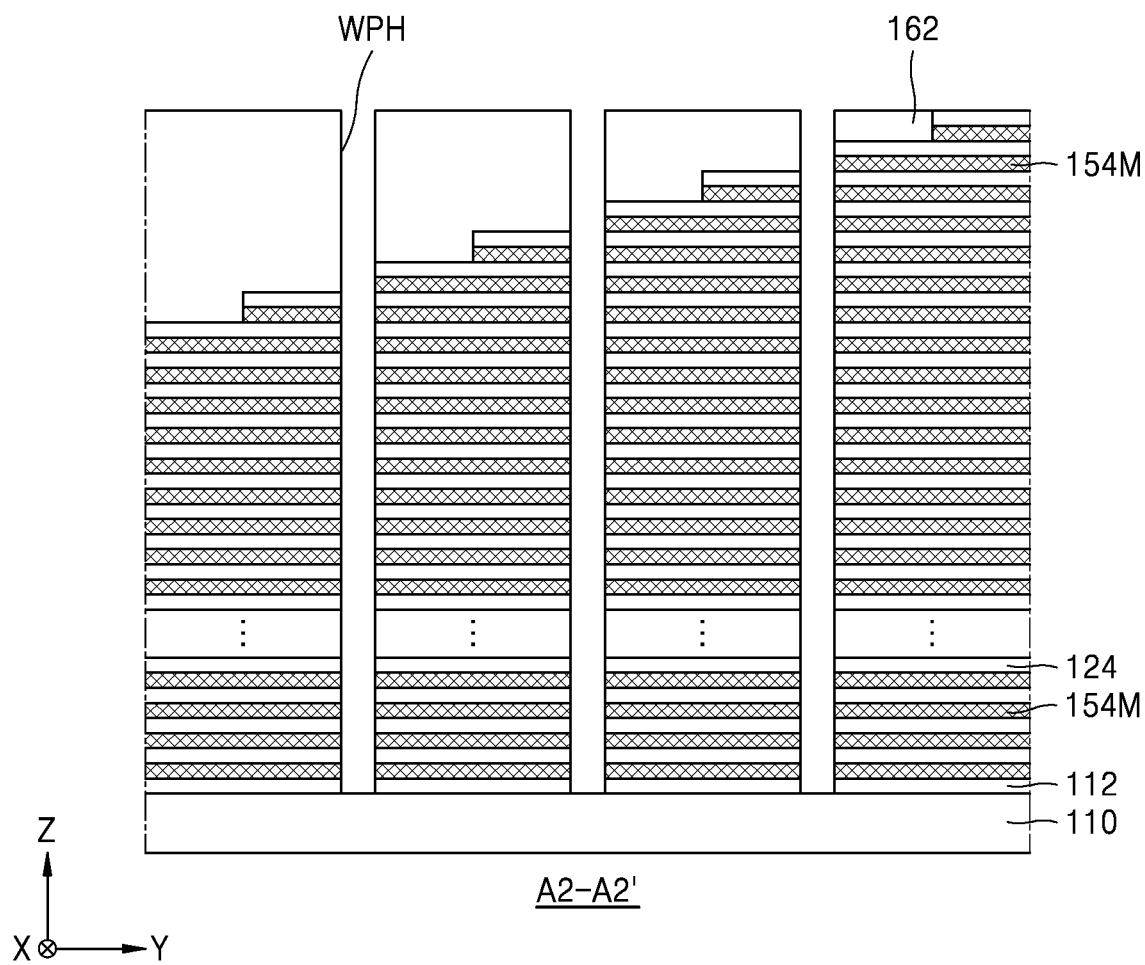
Figure 21:
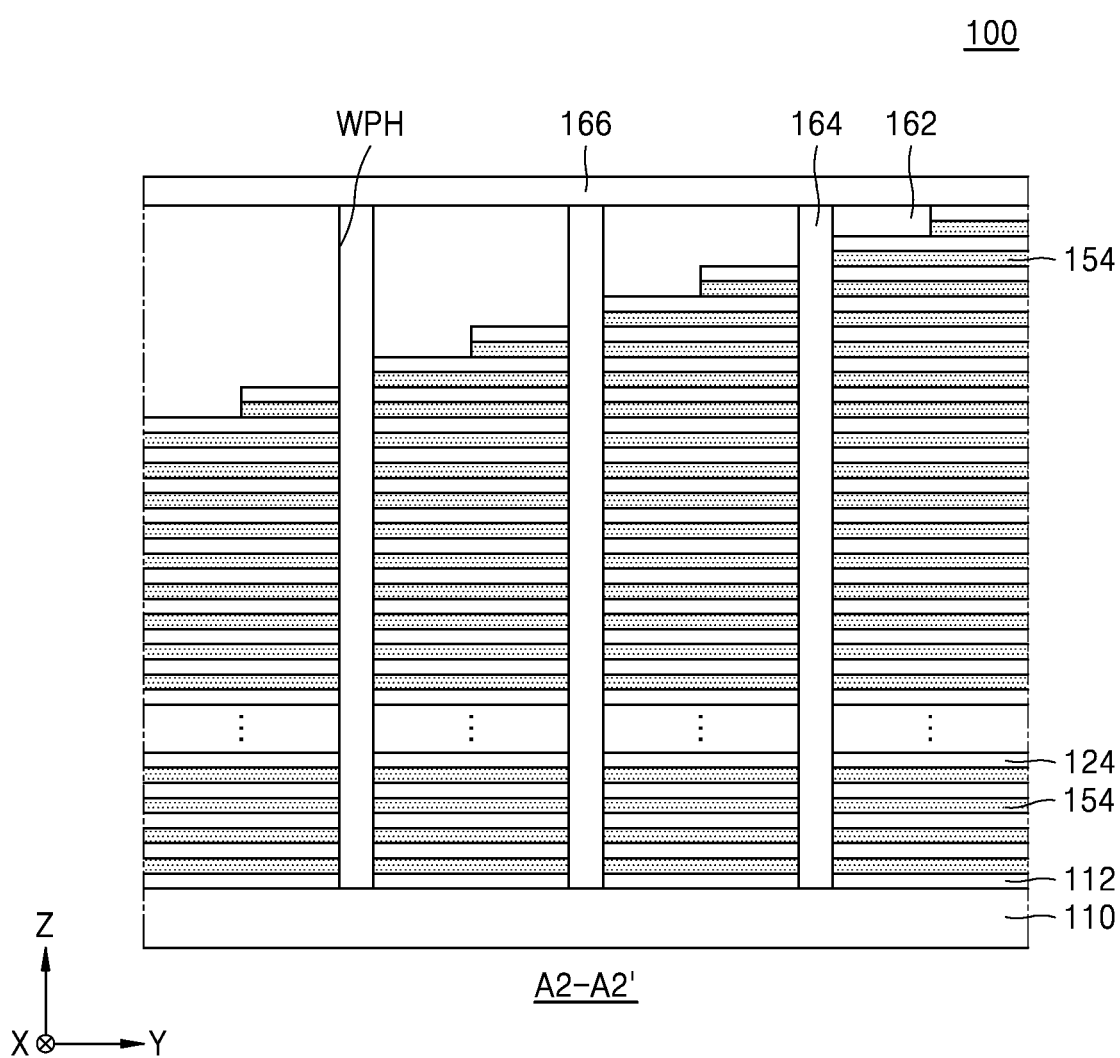

FIGS. 12A to 21 are schematic diagrams illustrating a method of manufacturing a three-dimensional memory device 100 according to an exemplary embodiment of the present inventive concept. FIGS. 12A, 13A, 14A, 15A, and 20A are plan views of the three-dimensional memory device 100 illustrated in the order of processes. FIGS. 12B, 13B, and 14B are cross-sectional views taken along the line A1-A1' of FIGS. 12A, 13A, and 14A. FIGS. 13C, 20B, and 21 are cross-sectional views taken along the line A2-A2' of FIGS. 13A and 20A, and FIGS. 15B and 16 to 19 are cross-sectional views taken along the line A3-A3' of FIG. 15A.

Figure 12A:
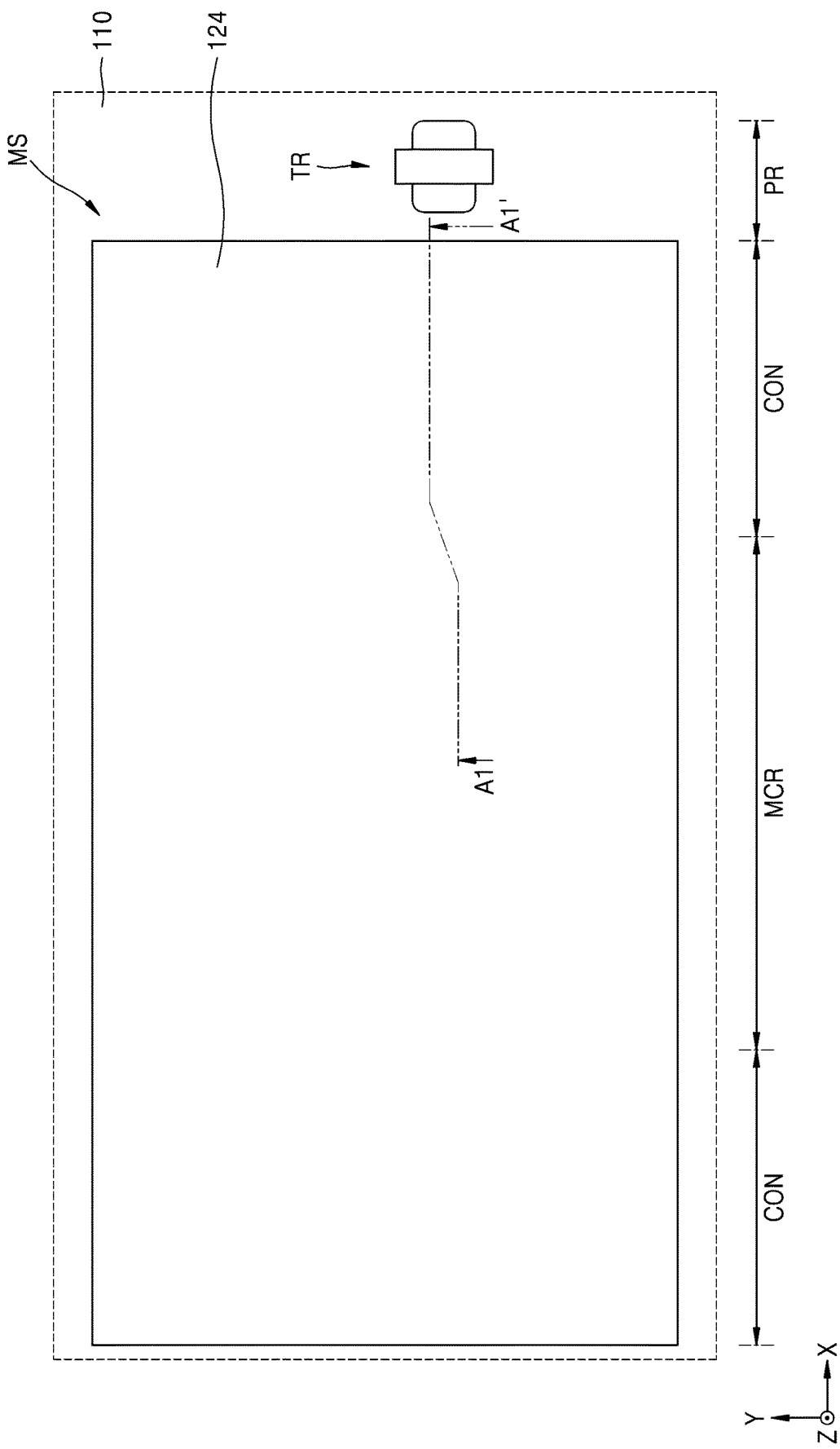
Figure 12B:
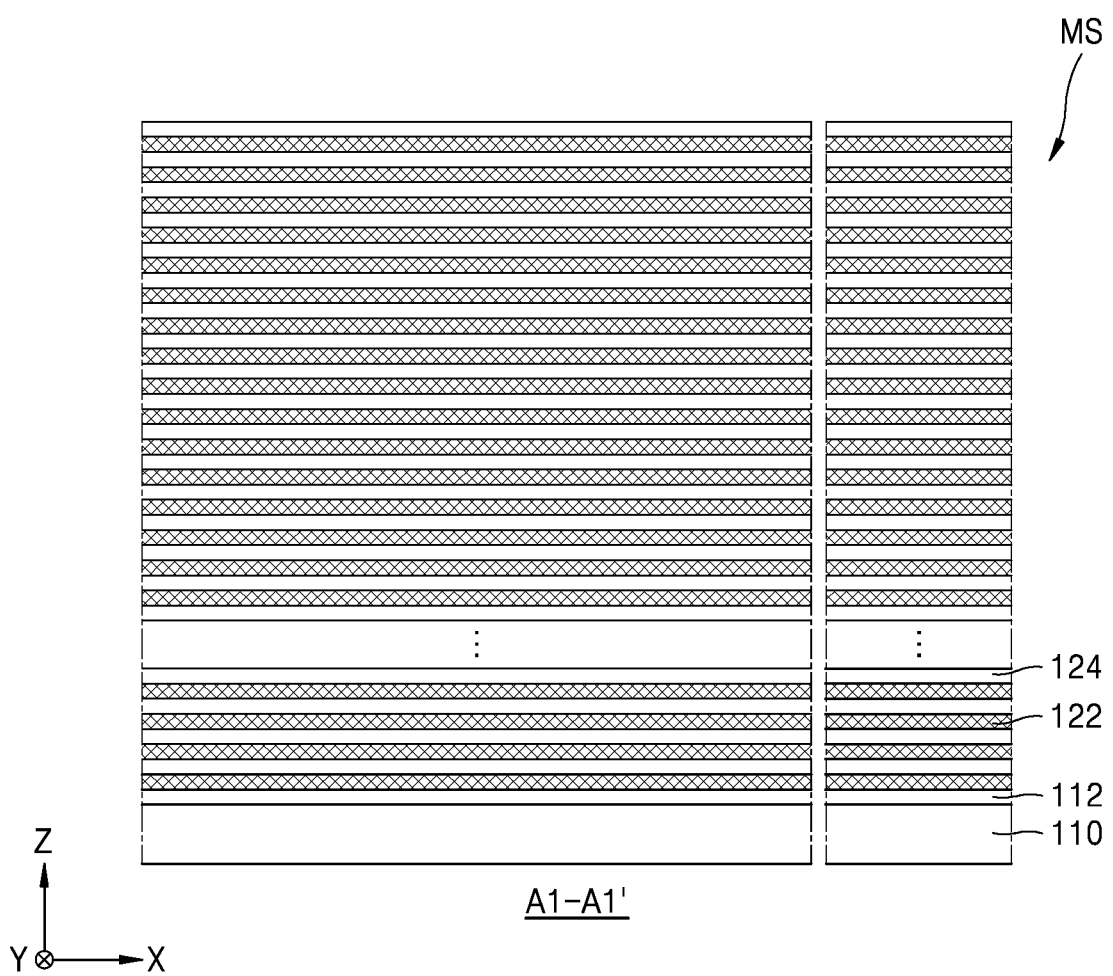
FIGS. 12B, 13B, and 14B are cross-sectional views taken along the line A1-A1' of FIGS. 12A, 13A, and 14A, FIGS. 13C, 20B, and 21 are cross-sectional views taken along the line A2-A2' of FIGS. 13A and 20A, and FIGS. 15B and 16, 17, 18 and 19 are cross-sectional views taken along the line A3-A3' of FIG. 15A.

Referring to FIGS. 12A and 12B, a mold stack MS may be formed by forming the lower insulating layer 112 on the substrate 110 and alternately forming the plurality of sacrificial layers 122 and the plurality of insulating layers 124 on the lower insulating layer 112.

In an exemplary of the present inventive concept, the plurality of sacrificial layers 122 and the plurality of insulating layers 124 may include materials having etch selectivity for each other. For example, the plurality of sacrificial layers 122 may include a polysilicon layer doped with p-type impurities or a polysilicon layer doped with n-type impurities, while the plurality of insulating layers 124 may include silicon oxide. An etch stop layer including silicon nitride may be formed on the uppermost insulating layer 124.

Figure 13B:
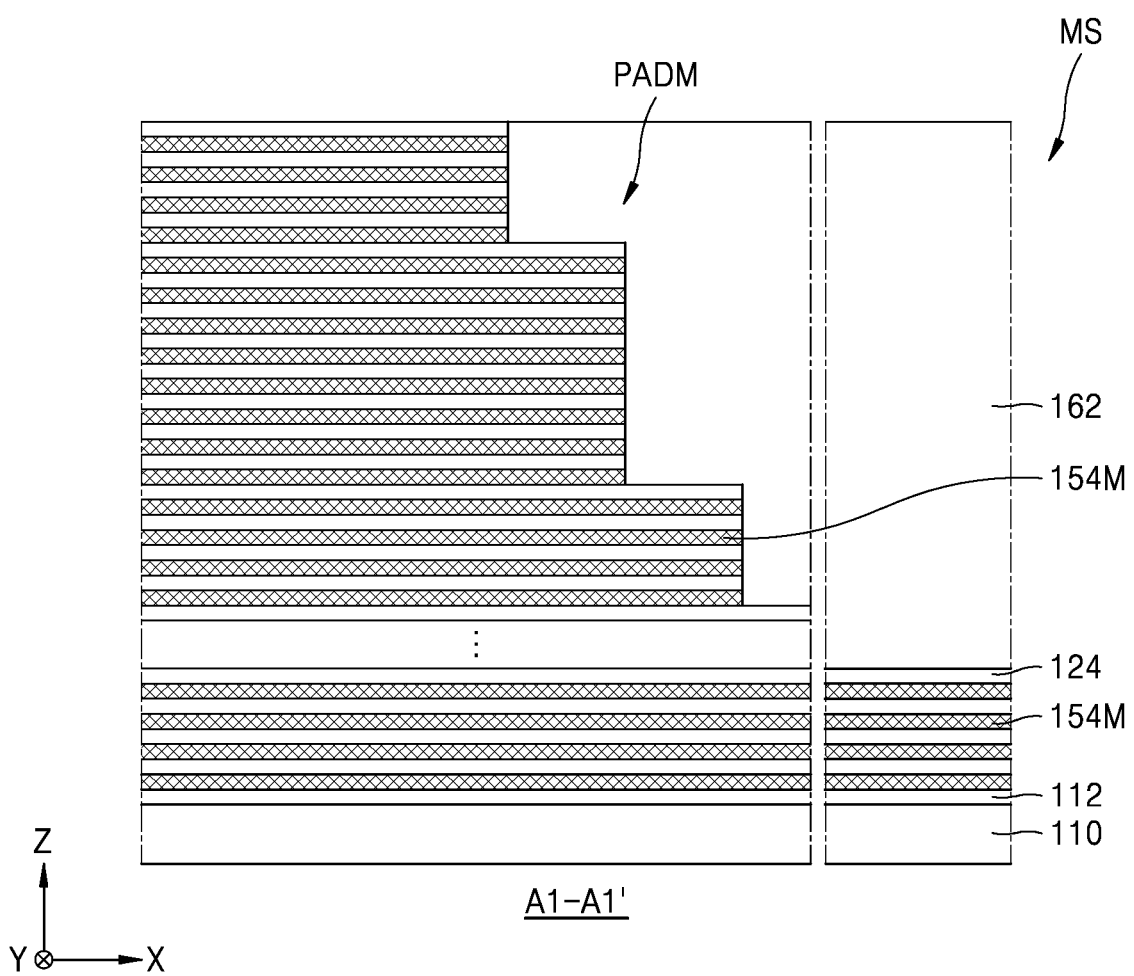
Figure 13C:
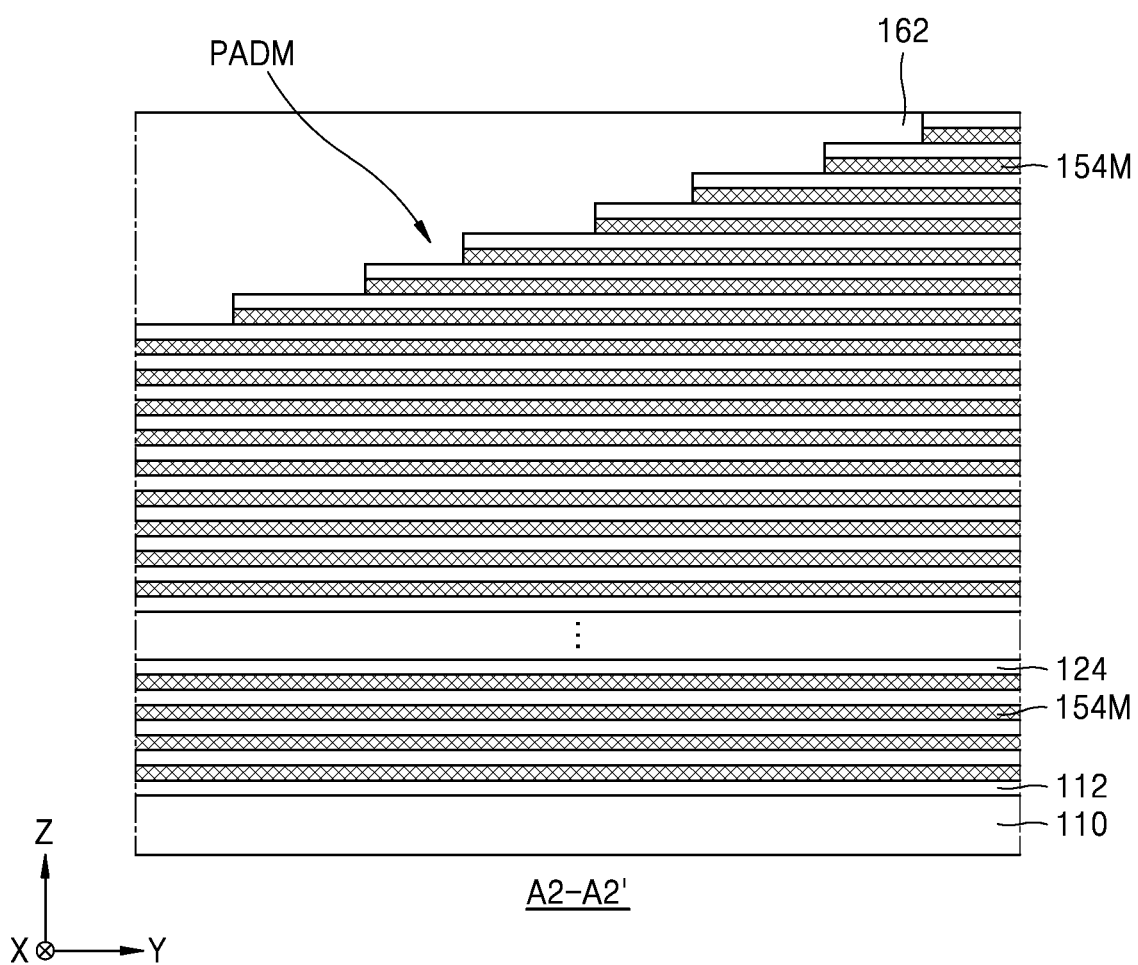

Referring to FIGS. 13A to 13C, a sacrificial pad structure PADM including sacrificial pad layers 154M may be formed by sequentially patterning the mold stack MS. For example, the sacrificial pad layers 154M may have a staircase shape in the first horizontal direction X and the second horizontal direction Y. For example, pad surfaces 154E (refer to FIG. 8A) of the sacrificial pad layers 154M may be arranged in a line in the first horizontal direction X and the second horizontal direction Y.

Then, the cover insulating layer 162 may be formed on the sacrificial pad structure PADM and may cover the sacrificial pad structure PADM. For example, the cover insulating layer 162 may cover the sacrificial pad layer 154M and the insulating layer 124.

Figure 14A:
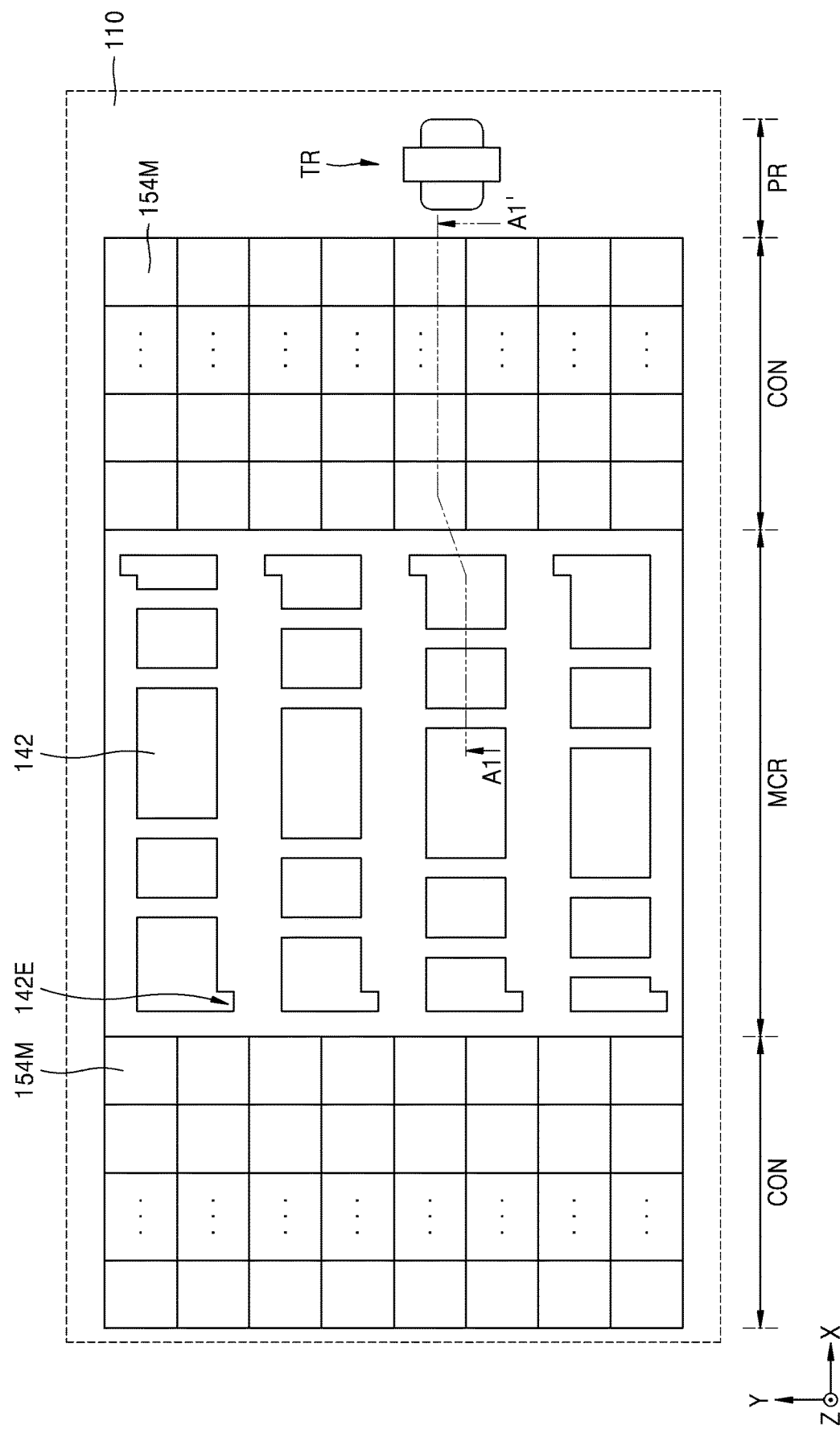
Figure 14B:
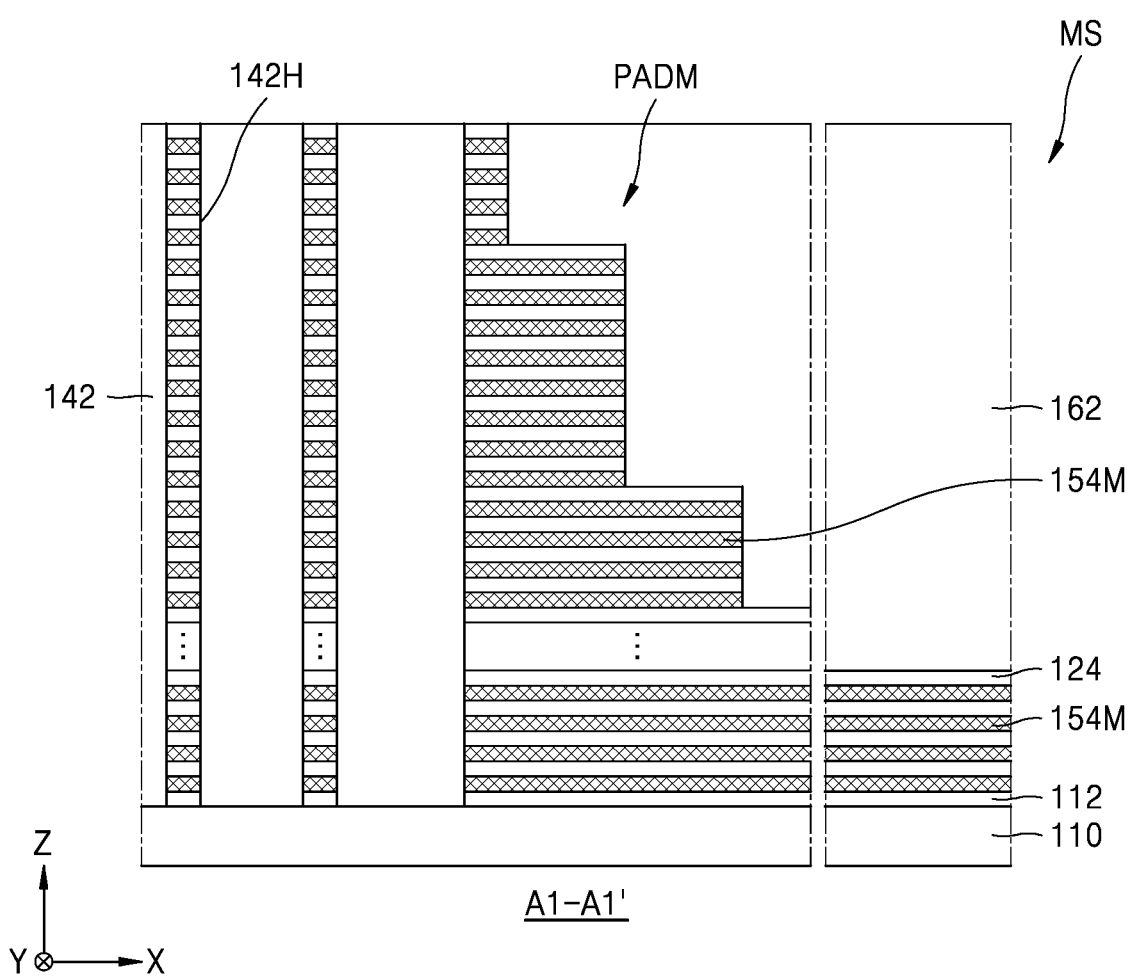

Referring to FIGS. 14A and 14B, a plurality of openings 142H may be formed in the memory cell region MCR by patterning the mold stack MS. The plurality of insulating patterns 142 may be formed in the plurality of openings 142H, and may fill the plurality of openings 142H with an insulating material. The plurality of insulating patterns 142 may extend from an upper surface of the substrate 110 in the vertical direction Z. In an exemplary embodiment of the present inventive concept, the plurality of insulating patterns 142 may include silicon oxide. At least one of the plurality of insulating patterns 142 may include an extension 142E (e.g., a protrusion) extending to be longer than another insulating pattern 142 in the second horizontal direction Y. For example, a first insulating pattern, of the plurality of insulating patterns 142, having the extension 142 may have a length greater than that of a second insulating pattern of the plurality of insulating patterns 142.

Figure 15B:
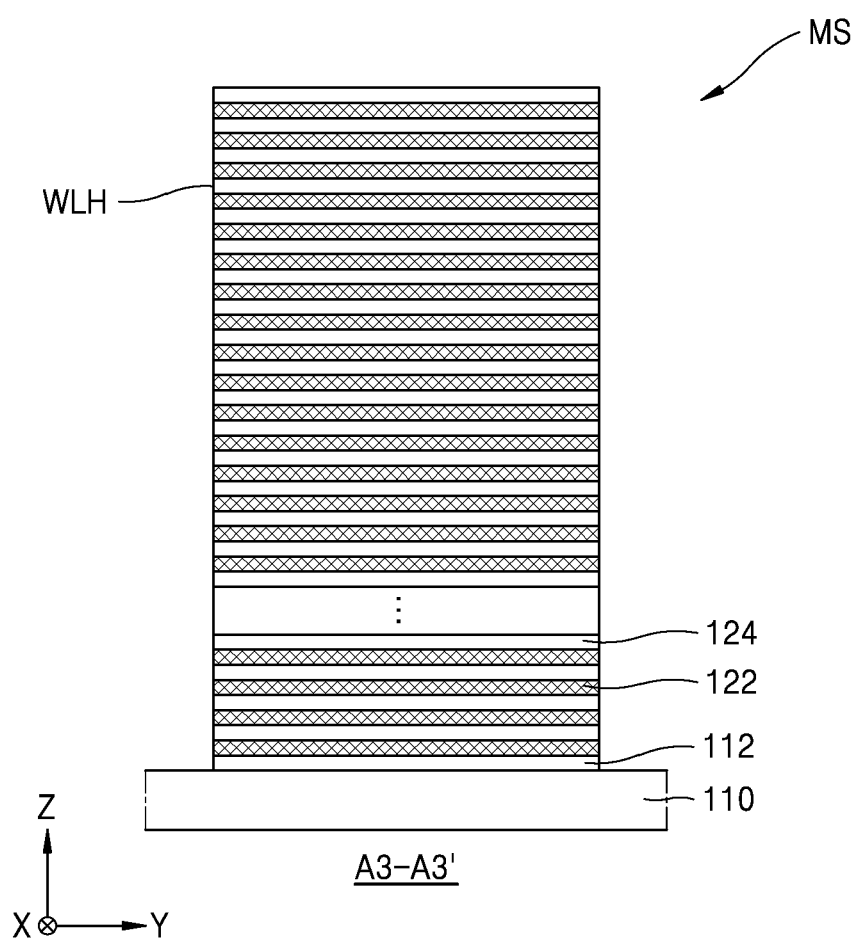

Referring to FIGS. 15A and 15B, a plurality of word line openings WLH may be formed in the memory cell region MCR by patterning the mold stack MS. The plurality of word line openings WLH may extend in the first horizontal direction X to expose side walls of the extensions 142E of the plurality of insulating patterns 142.

Figure 16:
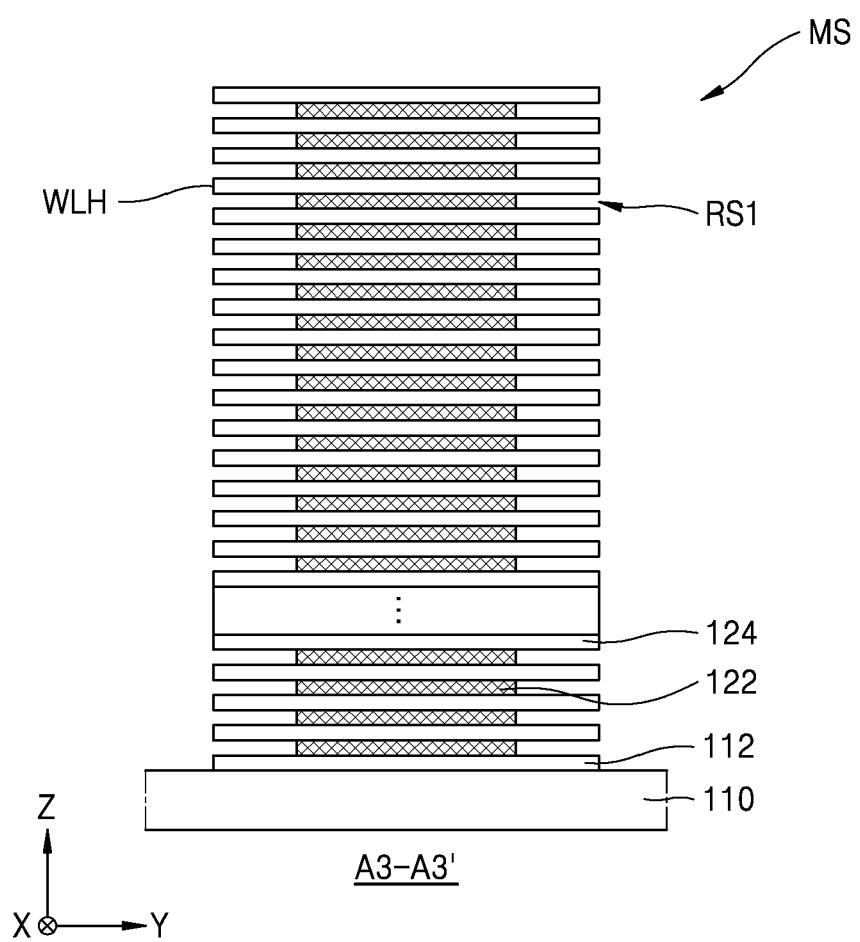

Referring to FIG. 16, a plurality of first recess regions RS1 connected to the plurality of word line openings WLH may be formed by removing parts of the plurality of sacrificial layers 122 exposed through the plurality of word line openings WLH. At this time, side walls of the plurality of insulating patterns 142 may be exposed by the plurality of first recess regions RS1.

Figure 17:
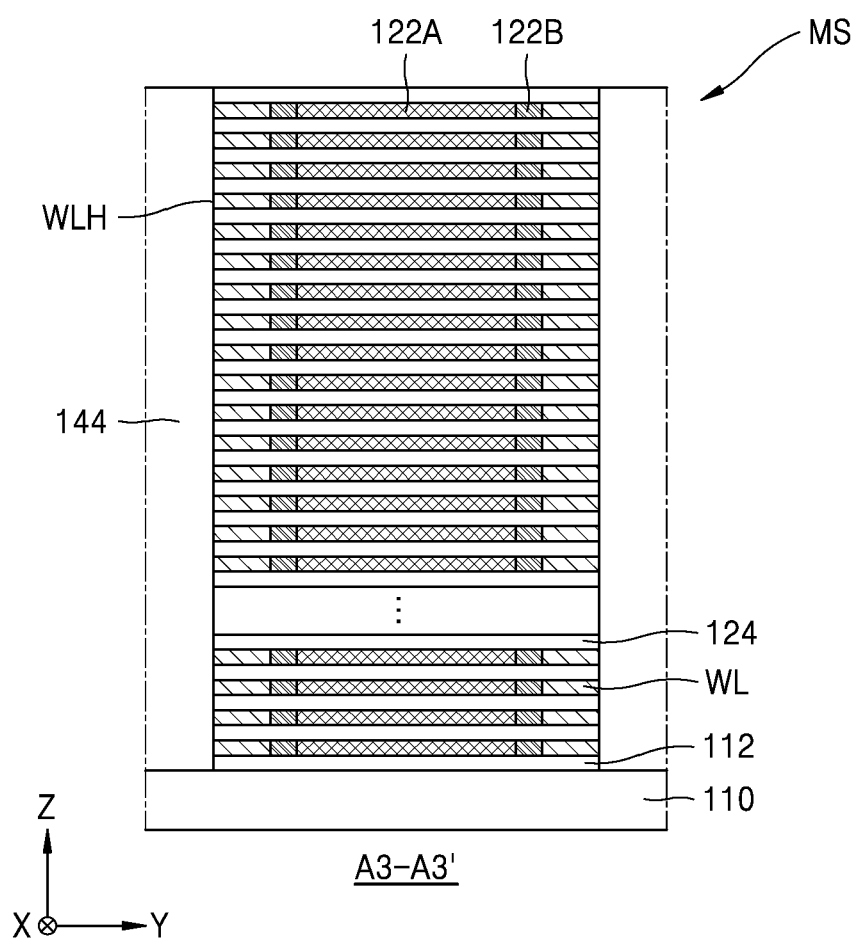

Referring to FIG. 17, a plurality of second junction patterns 122B may be formed in the plurality of first recess regions RS1. In an exemplary embodiment of the present inventive concept, the plurality of second junction patterns 122B may be formed by implanting n-type dopant or p-type dopant into parts of the plurality of sacrificial layers 122 exposed in the plurality of first recess regions RS1. In an exemplary embodiment of the present inventive concept, the plurality of second junction patterns 122B may be formed by depositing a polysilicon layer including n-type dopant or p-type dopant in the plurality of first recess regions RS1.

Then, a plurality of word lines WL filling the plurality of first recess regions RS1 may be formed. For example, the plurality of word lines WL may expose the side walls of the plurality of insulating layers 124 and may fill the plurality of first recess regions RS1, and the plurality of word lines WL may be formed by depositing a conductive material through the plurality of word line openings WLH so that the plurality of first recess regions RS1 are filled and by removing the conductive material remaining in the plurality of word line openings WLH.

Then, the buried insulating layer 144 filling the plurality of word line openings WLH may be formed.

Figure 18:
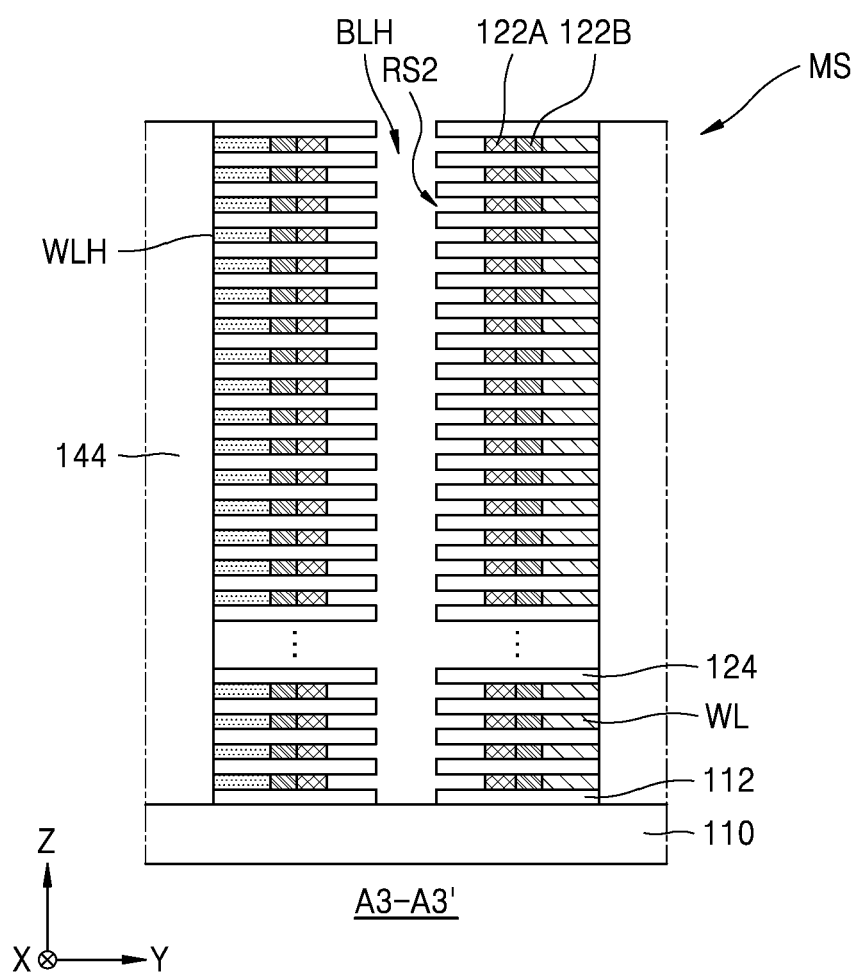

Referring to FIG. 18, a plurality of bit line openings BLH are formed by patterning the mold stack MS between two adjacent word line openings WLH. In addition, parts of the plurality of sacrificial layers 122, respectively exposed through the plurality of bit line openings BLH, are removed so that a plurality of second recess regions RS2 connected to the plurality of bit line openings BLH may be formed. As a result of forming the plurality of second recess regions RS2, the plurality of residing sacrificial layers 122 may be referred to as the plurality of first junction patterns 122A.

In an exemplary embodiment of the present inventive concept, an additional impurity doping process may be performed on the plurality of residing sacrificial layers 122.

Referring to FIG. 19, a plurality of electrode layers EL and a plurality of variable resistance memory components RM may be sequentially formed in the plurality of second recess regions RS2. For example, the plurality of electrode layers EL and the plurality of variable resistance memory components RM may be arranged in the plurality of second recess regions RS2 and the side walls of the plurality of insulating layers 124 may be exposed to the plurality of bit line openings BLH.

Referring to FIGS. 20A and 20B, a plurality of bit lines BL may be formed by filling the plurality of bit line openings BLH with a conductive material.

Then, the plurality of pad isolation openings WPH may be formed by patterning the mold stack MS in the connection region CON. The plurality of pad isolation openings WPH may extend in the first horizontal direction X and the vertical direction Z. The side walls of the plurality of insulating layers 124 and the side walls of the plurality of sacrificial layers 122 may be exposed in the plurality of pad isolation openings WPH.

Referring to FIG. 21, in the connection region CON, the plurality of sacrificial layers 122 may be removed and a pad space may be formed. In the process of removing the plurality of sacrificial layers 122, the plurality of sacrificial layers 122 adjacent to the plurality of word lines WL arranged at both ends of the memory cell region MCR may also be removed. In addition, a part of the pad space may extend in the second horizontal direction Y and may expose the side walls of the plurality of word lines WL. By filling the pad space with a conductive material, the plurality of connection units 152 and the plurality of pad layers 154 may be formed.

Therefore, each of the plurality of connection units 152 may be commonly connected to the plurality of word lines WL arranged at the same vertical level, and each of the plurality of pad layers 154 may be connected to each of the plurality of connection units 152 arranged at the same vertical level.

Then, the isolation insulating layer 164 filling the plurality of pad isolation openings WPH may be formed. The upper insulating layer 166 may be formed on the cover insulating layer 162 and the isolation insulating layer 164. For example, the upper insulating layer 166 may cover the cover insulating layer 162 and the isolation insulating layer 164.

Referring to FIGS. 3 to 5 again, the plurality of contact plugs 170 may be formed by forming contact holes exposing the plurality of pad surfaces 154E of the plurality of pad layers 154 in the upper insulating layer 166 and the cover insulating layer 162 and filling the contact holes with a conductive material.

Then, in the memory cell region MCR, the plurality of global bit lines GBL extending in the second horizontal direction Y may be formed on the plurality of bit lines BL.

The three-dimensional memory device 100 may be formed by performing the above-described processes. Because the plurality of word lines WL arranged at the same vertical level are connected to a common pad layer 154 in the three-dimensional memory device 100, the area of the pad formation region may be reduced and density may increase.

While the present inventive concept has been described with reference to embodiments thereof, it will be understood by those of ordinary skill in the art that various changes in form and details may be made thereto without departing from the spirit and scope of the present inventive concept.

What is claimed is:

1. A three-dimensional memory device comprising:
a plurality of word line groups spaced apart from one another on a substrate in a vertical direction, wherein each of the plurality of word line groups includes a plurality of word lines extending in a first horizontal direction and being spaced apart from one another in a second horizontal direction crossing the first horizontal direction;
a plurality of bit line groups spaced apart from one another on the substrate in the first horizontal direction, wherein each of the plurality of bit line groups extends in the vertical direction and includes a plurality of bit lines spaced apart from the plurality of word lines included in the plurality of word line groups in the second horizontal direction, wherein the vertical direction crosses the first and second horizontal directions;
a plurality of memory cells arranged between the plurality of word lines and the plurality of bit lines, wherein each of the plurality of memory cells includes a switching component and a resistance memory component;
a plurality of global bit line groups respectively connected to the plurality of bit line groups, wherein each of the plurality of global bit line groups includes a plurality of global bit lines electrically connected to a plurality of bit lines included in one bit line group, respectively, and extends in the second horizontal direction; and
a pad structure arranged on the substrate and including a plurality of connection units and a plurality of pad layers, wherein the plurality of connection units are respectively connected to the plurality of word line groups, and the plurality of pad layers respectively extend from the plurality of connection units.

2. The three-dimensional memory device of claim 1, wherein a first distance in the first horizontal direction between two bit line groups adjacent to each other in the first horizontal direction, among the plurality of bit line groups, is greater than a second distance in the first horizontal direction between two adjacent global bit lines among the plurality of global bit lines.

3. The three-dimensional memory device of claim 1, wherein a number of word lines included in each of the plurality of word line groups ranges from 3 to 20, and
a number of bit lines included in each of the plurality of bit line groups ranges from 3 to 20.

4. The three-dimensional memory device of claim 1, wherein a plurality of overlap positions are formed by plurality of bit lines included in each bit line group overlapping a plurality of global bit lines included in a global bit line group corresponding to the bit line group, wherein the plurality of overlap positions are spaced apart from one another in the second horizontal direction and the first horizontal direction.

5. The three-dimensional memory device of claim 1, wherein the plurality of word line groups comprise a plurality of first word line groups and a plurality of second word line groups, and
wherein one first word line included in the plurality of first word line groups and one second word line included in the plurality of second word line groups are spaced apart from each other in the second horizontal direction with at least one bit line therebetween.

6. The three-dimensional memory device of claim 5, wherein the pad structure comprises:
a first pad structure connected to the plurality of first word line groups; and
a second pad structure connected to the plurality of second word line groups.

7. The three-dimensional memory device of claim 6, wherein the substrate comprises a cell array region and a connection region, wherein the plurality of first word line groups, the plurality of second word line groups, and the plurality of bit line groups are arranged on the cell array region, and wherein the first pad structure is arranged at a first side of the cell array region, and the second pad structure is arranged at a second side of the cell array region.

8. The three-dimensional memory device of claim 1, wherein the pad structure includes a staircase shape extending in the first horizontal direction and the second horizontal direction.

9. The three-dimensional memory device of claim 1, wherein a first pad layer connected to a plurality of word lines included in a first word line group among the plurality of word line groups is spaced apart from a second pad layer connected to a plurality of word lines included in a second word line group adjacent to the first word line group in the second horizontal direction.

10. The three-dimensional memory device of claim 9, wherein a first distance in the first horizontal direction from the first pad layer to a first connection unit among the plurality of connection units is substantially equal to a second distance in the first horizontal direction from the second pad layer to the first connection unit.

11. The three-dimensional memory device of claim 1, further comprising a plurality of bit line contacts arranged on the plurality of bit lines corresponding to global bit lines, and wherein a first plurality of bit line contacts among the plurality of bit line contacts are arranged on a plurality of bit lines included in one bit line group, and the first plurality of bit line contacts are spaced apart from one another in the first horizontal direction and the second horizontal direction.

12. The three-dimensional memory device of claim 1, wherein each global bit line is slanted at an inclination angle of about 1 degree to about 20 degrees with respect to the second horizontal direction.

13. The three-dimensional memory device of claim 1, wherein each of the plurality of word lines has a first thickness in the vertical direction, and wherein each of the plurality of pad layers has a second thickness greater than the first thickness in the vertical direction.

14. A three-dimensional memory device comprising:
a plurality of word lines extending in a first horizontal direction on a substrate and spaced apart from one another in a second horizontal direction and a vertical direction, wherein the second horizontal direction crosses the first horizontal direction, and the vertical direction crosses the first and second horizontal directions;
a plurality of bit lines disposed on the substrate, and extending in the vertical direction, wherein the plurality of bit lines are spaced apart from the plurality of word lines in the second horizontal direction, and spaced apart from one another in the first horizontal direction;
a plurality of memory cells arranged between the plurality of word lines and the plurality of bit lines, wherein each of the plurality of memory cells includes a switching component and a variable resistance memory component;
a plurality of global bit lines arranged on the plurality of bit lines and extending in the second horizontal direction; and
a pad structure arranged on the substrate and including a plurality of connection units and a plurality of pad layers, wherein each of the plurality of connection units is commonly connected to at least two word lines arranged at the same vertical level among the plurality of word lines, wherein each of the plurality of pad layers extends from the plurality of connection units, and wherein the pad structure includes a staircase shape in the first horizontal direction and the second horizontal direction.

15. The three-dimensional memory device of claim 14, wherein a first pad layer connected to at least two word lines arranged at a first vertical level among the plurality of word lines is spaced apart from a second pad layer adjacent to the first pad layer and arranged at a second vertical level different from the first vertical level.

16. The three-dimensional memory device of claim 14, wherein a first distance in the first horizontal direction from a first pad layer to a first connection unit among the plurality of connection units is substantially equal to a second distance in the first horizontal direction from a second pad layer to the first connection unit.

17. The three-dimensional memory device of claim 14, wherein the plurality of word lines comprise a plurality of first word lines and a plurality of second word lines alternately arranged in the second horizontal direction, and wherein each of a plurality of bit lines is arranged between a first-first word line of the plurality of first word lines and a first-second word line of the plurality of second word lines that is adjacent to the first-first word line.

18. The three-dimensional memory device of claim 17, wherein the pad structure comprises:
a first pad structure connected to one end of each of the plurality of first word lines; and
a second pad structure connected to one end of each of the plurality of second word lines,
wherein the plurality of first word lines and the plurality of second word lines are arranged between the first pad structure and the second pad structure.

19. A three-dimensional memory device comprising:
a peripheral circuit structure arranged on a substrate; and
a memory cell array arranged on the peripheral circuit structure,
wherein the memory cell array comprises:
a plurality of first word lines extending in a first horizontal direction and spaced apart from one another in a second horizontal direction and a vertical direction, wherein the second horizontal direction crosses the first horizontal direction, and the vertical direction crosses the first and second horizontal directions;
a plurality of second word lines spaced apart from the plurality of first word lines in the second horizontal direction and extending in the first horizontal direction;
a plurality of bit lines arranged between the plurality of first word lines and the plurality of second word lines, and extending in the vertical direction, wherein the plurality of bit lines are spaced apart from one another in the first horizontal direction;
a plurality of memory cells arranged between the plurality of first word lines and the plurality of bit lines and between the plurality of second word lines and the plurality of bit lines, wherein each of the plurality of memory cells includes a switching component and a variable resistance memory component;
a plurality of global bit lines arranged on the plurality of bit lines and extending in the second horizontal direction;
a first pad structure connected to the plurality of first word lines and including a plurality of first connection units and a plurality of first pad layers respectively extending from the plurality of first connection units, wherein each of the plurality of first connection units is connected to at least two first word lines arranged at the same vertical level among the plurality of first word lines; and a second pad structure connected to the plurality of second word lines and including a plurality of second connection units, each of which is, and a plurality of second pad layers respectively extending from the plurality of second connection units, wherein each of the plurality of second connection units is connected to at least two second word lines arranged at the same vertical level among the plurality of second word lines, and wherein each of the first pad structure and the second pad structure includes a staircase shape in the first horizontal direction and the second horizontal direction.

20. The three-dimensional memory device of claim 19, wherein a first distance in the first horizontal direction between two bit lines, among the plurality of bit lines, adjacent to each other in the first horizontal direction is greater than a second distance in the first horizontal direction between two adjacent global bit lines among the plurality of global bit lines.

* * * * *